US009258003B2

(12) United States Patent
Oshima et al.

(10) Patent No.: US 9,258,003 B2
(45) Date of Patent: Feb. 9, 2016

(54) ELECTRONIC SYSTEM AND OPERATING METHOD THEREOF

(71) Applicant: RENESAS ELECTRONICS CORPORATION, Kanagawa (JP)

(72) Inventors: Takashi Oshima, Tokyo (JP); Tatsuji Matsuura, Kanagawa (JP); Yuichi Okuda, Kanagawa (JP); Hideo Nakane, Kanagawa (JP); Takaya Yamamoto, Kanagawa (JP); Keisuke Kimura, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/711,200

(22) Filed: May 13, 2015

(65) Prior Publication Data

US 2015/0249459 A1 Sep. 3, 2015

Related U.S. Application Data

(63) Continuation of application No. 14/274,813, filed on May 12, 2014, now Pat. No. 9,054,723.

(30) Foreign Application Priority Data

May 13, 2013 (JP) ................................ 2013-101038

(51) Int. Cl.

| | |
|---|---|
| ***H03M 1/00*** | (2006.01) |
| ***H03M 1/10*** | (2006.01) |
| ***H03M 1/12*** | (2006.01) |
| ***H03M 1/66*** | (2006.01) |

(52) U.S. Cl.

CPC ............ *H03M 1/1033* (2013.01); *H03M 1/002* (2013.01); *H03M 1/12* (2013.01); *H03M 1/66* (2013.01)

(58) Field of Classification Search

CPC ...... H03M 1/1033; H03M 1/12; H03M 1/002

USPC ................................. 341/120, 155, 110, 144

See application file for complete search history.

(56) References Cited

U.S. PATENT DOCUMENTS 5,248,970 A 9/1993 Sooch et al.
5,596,322 A * 1/1997 Marsh et al. ........ H03M 1/1009 341/118

(Continued)

FOREIGN PATENT DOCUMENTS

JP 2009-130444 A 6/2009
JP 2009-159415 A 7/2009

OTHER PUBLICATIONS

Oshima et al., "23mW 50-MS/s 10-bit Pipeline A/D Converter with Nonlinear LMS Foreground Calibration", 2009 International Symposium on Circuits and and Systems, pp. 960-963.

*Primary Examiner* — Brian Young

(74) *Attorney, Agent, or Firm* — Mattingly & Malur, PC

(57) ABSTRACT

To compensate for non-linearity of an AD conversion unit and non-linearity of a DA conversion unit in an electronic system including the DA conversion unit and the AD conversion unit, an electronic system includes an A/D conversion unit, a D/A conversion unit, an AD conversion compensation unit, a DA conversion compensation unit, and a calibration unit. During a calibration operation period, the calibration unit sets an operating characteristic of the AD conversion compensation unit and an operating characteristic of the DA conversion compensation unit. The operating characteristic of the AD conversion compensation unit set during the calibration operation period compensates for non-linearity of AD conversion of the A/D conversion unit. The operating characteristic of the DA conversion compensation unit set during the calibration operation period compensates for non-linearity of DA conversion of the D/A conversion unit.

5 Claims, 13 Drawing Sheets

(56) References Cited

U.S. PATENT DOCUMENTS 6,442,213 B1 * 8/2002 Krone ................ H04L 25/0266
341/118
7,330,739 B2 * 2/2008 Somayajula ........ H04M 1/6016
379/388.07
7,843,369 B2 11/2010 Takahashi et al.
8,169,350 B2 5/2012 Oshima et al.

* cited by examiner

1
DAIN
$D_k$
DAC_ Compensation1
15
14
Search_Eng1
141
$X_k$
Search_Eng2
142
140
e
$\sum_{k=1}^{M} X_k \cdot D_k$
ADOUT
$\sum_{k=1}^{N} W_k \cdot b_k$
13
ADC_ Compensation
$W_k$
16
DAC_ Compensation2
$D'_k$
17
Cnt4
SEL
$b_k$
11
DAC
M bit
10
ADC
N bit
Digital
Analog
12
Cnt1
Cnt2
18
Cnt3
19
DAOUT
ADIN 10
10N
SADC
$b_N$
10N−1
$MDAC_{N-1}$
$d_{N-1}$
$b_{N-1}$
Dither_genN−1
102
$MDAC_2$
$d_2$
$b_2$
Dither_gen2
101
$MDAC_1$
$d_1$
$b_1$
Dither_gen1
ADIN
$V_{OUT}$
$G_{N-1}$
10N−14
10N−17
10N−1
10N−13
SDAC
10N−12
10N−16
$\alpha_{N-1}$
PNG
10N−15
SADC
10N−11
Dither_genN−1
$d_{N-1}$
$b_{N-1}$
$V_{IN}$ 10
10A
CMP
+
-
ADIN
10B
Controller
10C
SDAC
10H
b1
b2
b3
bN-1
bN
d1
d2
d3
dN-1
dN
PNG
10D
Dither_gen
αk
10E
SDAC
10G 1
DAIN
$D_k$
ADOUT
140
e
14
Search_Eng1
142
Search_Eng2
141
$X_k$
13
ADC_
Compensation
16
DAC_
Compensation2
$\alpha_k, W_k$
$\sum_{k=1}^{N} W_k \cdot (b_k + \alpha_k d_k)$
Digital
$d_k, b_k$
$D'_k$
11
DAC
M bit
Dither_gen
10
ADC
N bit
12
Analog
Cnt2
18
Cnt1
19
Cnt3
DAOUT
ADIN 1
RF IC
Rx_A/D
ADC
ADC
Rx_I
Rx_Q
1328
PGA2
1327
LPF
1326
PGA1
1325
RxMIX
1324
LNA
RF Rx
1340
Xtal
TCXO
1339
PLL
1330
Tx_D/A
DAC
DAC
Tx_I
Tx_Q
LPF
1332
TxMIX
1333
1335
DR
RF Tx
1336
PA
BPF
RF Out
133
SAW
RF In
ANT_SW
132
ANT
131

1
1410
1420
1430
Voltage supply
1414
CPU
FPU
MULT
1411
Flash ROM
1412
RAM
1413
Int_Adrs_Bus
Int_Dt_Bus
DMAC
1421
BSC
1422
ICU
1423
Ph_Adrs_Bus
Ph_Dt_Bus
SCI
1427
Ext_port
1426
CAN
1425
Timer
1424
DAC
1432
ADC
1431

ELECTRONIC SYSTEM AND OPERATING METHOD THEREOF

CROSS-REFERENCE TO RELATED APPLICATIONS

This application is a continuation of U.S. patent application Ser. No. 14/274,813, filed May 12, 2014, which claims priority to Japanese Patent Application No. 2013-101038 filed on May 13, 2013, the disclosure of which, including the specification, drawings and abstract, is incorporated herein by reference in its entirety.

BACKGROUND

The present invention relates to an electronic system and an operating method thereof, and particularly to a technique effective in compensating for non-linearity of an AD conversion unit and non-linearity of a DA conversion unit in an electronic system including the DA conversion unit and the AD conversion unit.

The following Patent Document 1 describes an A/D converter called a background digital correction type A/D converter. The background digital correction type A/D converter includes a main A/D conversion unit which performs a high-speed A/D conversion operation with low precision, a reference A/D conversion unit which performs high-resolution A/D conversion at low speed, and a digital correction unit which generates a final digital output signal from a digital signal of the main A/D conversion unit and a digital signal of the reference A/D conversion unit.

The following Patent Document 2 and Non-patent Document 1 describe an A/D converter called a foreground digital correction type A/D converter. The foreground digital correction type A/D converter includes a main A/D conversion unit, a reference D/A conversion unit, a switch, a foreground calibration unit, and a digital output generation unit. During a calibration operation period, a calibration digital signal is converted into a calibration analog signal by the reference D/A conversion unit, and the calibration analog signal is supplied to an input terminal of the main A/D conversion unit via the switch. A digital signal generated from an output terminal of the main A/D conversion unit is supplied to an input terminal of the digital output generation unit, the calibration digital signal and a final digital output signal of the digital output generation unit are supplied to the foreground calibration unit, and an output signal of the foreground calibration unit is supplied to a control input terminal of the digital output generation unit. As a result, the digital output generation unit is controlled by the output signal of the foreground calibration unit so that the calibration digital signal supplied to the foreground calibration unit and the final digital output signal of the digital output generation unit agree with each other.

[Patent Document 1]

Japanese Unexamined Patent Publication No. 2009-130444

[Patent Document 2]

Japanese Unexamined Patent Publication No. 2009-159415

[Non-Patent Document 1]

Takashi Oshima et al, "23 mW 50-MS/s 10-bit Pipeline A/D Converter with Nonlinear LMS Foreground Calibration", 2009 International Symposium on Circuits and Systems, PP. 960-063

SUMMARY

Prior to the present invention, the inventors of the present invention have engaged in research/development of high-precision AD converters and DA converters incorporated in a radio-frequency semiconductor integrated circuit (RFIC) for radio communication and a large-scale integrated circuit (LSI) such as a microcontroller and a microcomputer.

In this research/development, prior to the present invention, the inventors have examined the background digital correction type A/D converter described in Patent Document 1 and found the following problem. That is, an area occupied by the semiconductor chip of the reference A/D conversion unit which performs low-speed high-resolution A/D conversion in the background digital correction type A/D converter is relatively large, which extremely increases the total area occupied by the semiconductor chip of the built-in A/D converter.

Further, in this research/development, prior to the present invention, the inventors have examined the foreground digital correction type A/D converter described in Patent Document 2 and Non-patent Document 1, and found the following problem. That is, in the foreground digital correction type A/D converter, the non-linearity of the main A/D conversion unit itself can be calibrated and improved during the calibration operation period, which can reduce an area occupied by the semiconductor chip of the main A/D conversion unit and the power consumption of the main A/D conversion. However, in the foreground digital correction type A/D converter, it is necessary to enhance the precision of the analog output signal of the reference D/A conversion unit supplied to the input terminal of the main A/D conversion unit during the calibration operation period, which increases an area occupied by the semiconductor chip of the reference D/A conversion unit, the power consumption of the reference D/A conversion unit, and manhours for designing the reference D/A conversion unit. For example, if the resolution of DA conversion of the reference D/A conversion unit is increased by 1 bit to enhance the precision, the area occupied by the semiconductor chip and the power consumption increase by a factor of approximately 4.

While means for solving these problems will be described below, the other problems and novel features will become apparent from the description of this specification and the accompanying drawings.

A typical embodiment disclosed in the present application will be briefly described as follows.

An electronic system (1) according to the typical embodiment includes an A/D conversion unit (10), a D/A conversion unit (11), an AD conversion compensation unit (13), a DA conversion compensation unit (15, 16, 16A), and a calibration unit (14).

During a calibration operation period, the calibration unit (14) sets an operating characteristic of the AD conversion compensation unit (13) and an operating characteristic of the DA conversion compensation unit (15, 16, 16A) in response to a signal supplied to one input terminal and a signal supplied to the other input terminal.

The operating characteristic of the AD conversion compensation unit (13) set during the calibration operation period compensates for non-linearity of AD conversion of the A/D conversion unit (10).

The operating characteristic of the DA conversion compensation unit (15, 16, 16A) set during the calibration operation period compensates for non-linearity of DA conversion of the D/A conversion unit (11) (see FIG. 1).

An effect obtained by the typical one of the embodiments disclosed in the present application will be briefly described as follows.

According to the present electronic system, it is possible to compensate for the non-linearity of the AD conversion unit and the non-linearity of the DA conversion unit in the electronic system including the DA conversion unit and the AD conversion unit.

DETAILED DESCRIPTION

1. Outline of Embodiments

Figure 1:
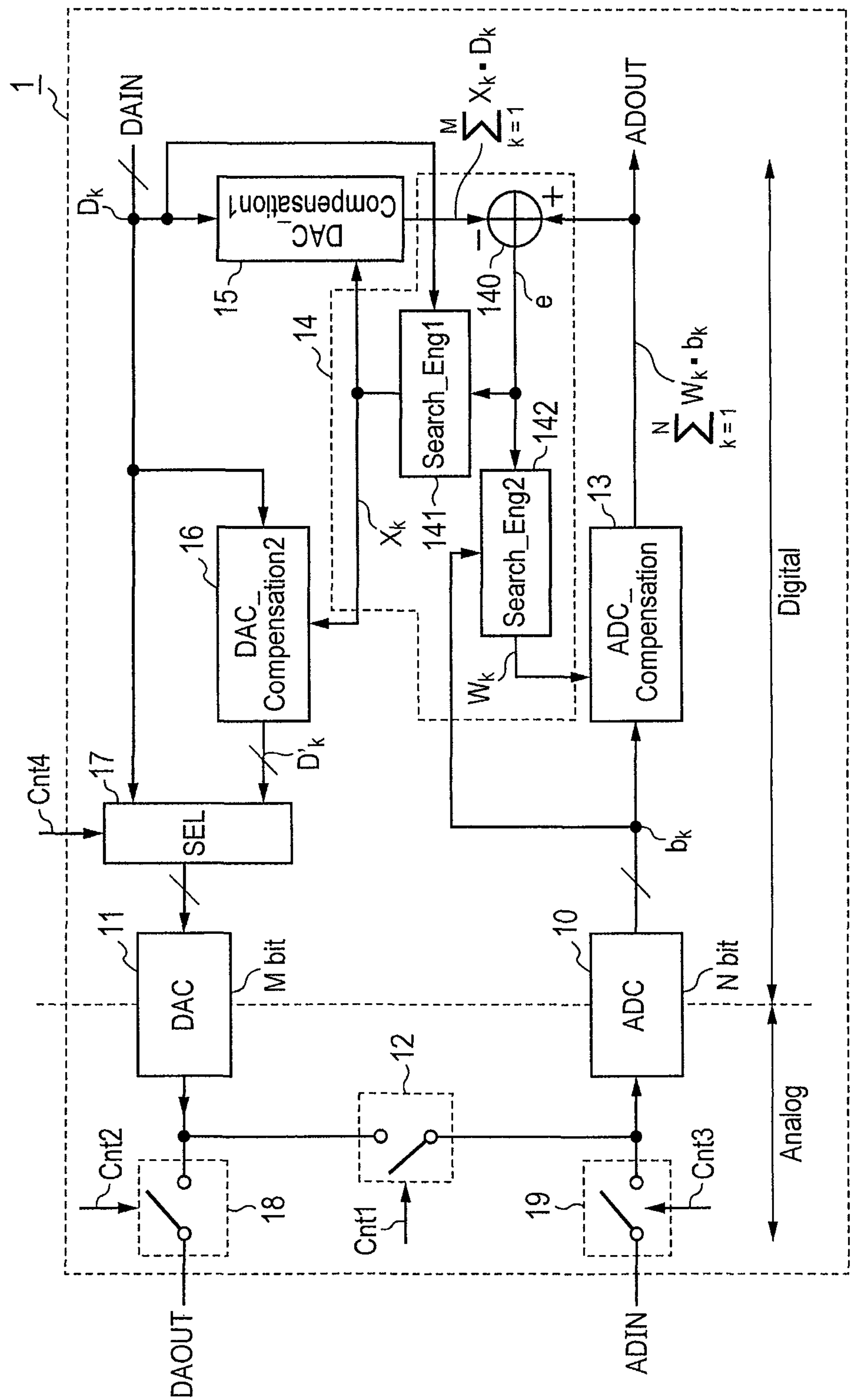
FIG. 1 is a diagram showing the configuration of an electronic system 1 according to a first embodiment.

First, exemplary embodiments of the invention disclosed in the present application will be outlined. Reference numerals in the drawings that refer to with parentheses applied thereto in the outline description of the exemplary embodiments are merely illustration of ones contained in the concepts of components marked with the reference numerals.

[1] An electronic system (1) according to an exemplary embodiment includes an A/D conversion unit (10), a D/A conversion unit (11), an AD conversion compensation unit (13), a DA conversion compensation unit (15, 16, 16A), and a calibration unit (14).

During a calibration operation period, a calibration digital input signal (DAIN) is supplied to the DA conversion compensation unit (15, 16, 16A), and either the calibration digital input signal (DAIN) or a DA conversion compensation calibration digital output signal generated from the DA conversion compensation unit is supplied to an input terminal of the D/A conversion unit (11).

During the calibration operation period, a calibration analog signal generated from an output terminal of the D/A conversion unit (11) can be supplied to an input terminal of the A/D conversion unit (10), and a calibration digital output signal (bk) generated from an output terminal of the A/D conversion unit (10) is supplied to an input terminal of the AD conversion compensation unit (13).

During the calibration operation period, either the calibration digital input signal or the DA conversion compensation calibration digital output signal is supplied to one input terminal of the calibration unit (14), and an AD conversion compensation calibration digital output signal generated from the AD conversion compensation unit is supplied to the other input terminal of the calibration unit (14).

During the calibration operation period, the calibration unit (14) sets an operating characteristic of the AD conversion compensation unit (13) and an operating characteristic of the DA conversion compensation unit (15, 16, 16A) in response to the signal supplied to the one input terminal and the signal supplied to the other input terminal.

The operating characteristic of the AD conversion compensation unit (13) set during the calibration operation period compensates for non-linearity of AD conversion of the A/D conversion unit (10).

The operating characteristic of the DA conversion compensation unit (15, 16, 16A) set during the calibration operation period compensates for non-linearity of DA conversion of the D/A conversion unit (11) (see FIG. 1).

According to the above embodiment, it is possible to compensate for the non-linearity of the AD conversion unit and the non-linearity of the DA conversion unit in the electronic system including the DA conversion unit and the AD conversion unit.

In a preferred embodiment, the DA conversion compensation unit includes a first DA conversion compensation unit (15) and a second DA conversion compensation unit (16).

During the calibration operation period, the calibration digital input signal (DAIN) is supplied to an input terminal of the first DA conversion compensation unit (15), and thereby the DA conversion compensation calibration digital output signal generated from an output terminal of the first DA conversion compensation unit is supplied to the one input terminal of the calibration unit (14).

An operating characteristic of the first DA conversion compensation unit (15) set by the calibration unit (14) during the calibration operation period emulates the non-linearity of the DA conversion of the D/A conversion unit (11) during the calibration operation period.

During a normal operation period after the calibration operation period, a digital input signal (DAIN) is supplied to an input terminal of the second DA conversion compensation unit (16), and thereby a digital compensation output signal generated from an output terminal of the second DA conversion compensation unit (16) is supplied to the input terminal of the D/A conversion unit (11).

An operating characteristic of the second DA conversion compensation unit (16) set by the calibration unit (14) based on a calibration result during the calibration operation period substantially cancels the non-linearity of the DA conversion of the D/A conversion unit (11) (see FIG. 1).

In another preferred embodiment, during the calibration operation period and the normal operation period, the operating characteristic of the AD conversion compensation unit (13) substantially cancels the non-linearity of the AD conversion of the AD conversion unit (10) (see FIG. 1).

In yet another preferred embodiment, the electronic system (1) further includes a selector unit (17) having a first input terminal, a second input terminal, and an output terminal.

During the calibration operation period, the calibration digital input signal (DAIN) is supplied to the first input terminal of the selector unit (17), and the calibration digital input signal transferred to the output terminal of the selector unit is supplied to the input terminal of the D/A conversion unit (11).

During the normal operation period, the digital compensation output signal generated from the output terminal of the second DA conversion compensation unit (16) is supplied to the second input terminal of the selector unit (17), and the digital compensation output signal transferred to the output terminal of the selector unit is supplied to the input terminal of the D/A conversion unit (11) (see FIG. 1).

In a more preferred embodiment, the calibration unit (14) includes a subtraction unit (140), a first search engine (141), and a second search engine (142).

The subtraction unit (140) calculates a difference between the signal supplied to the one input terminal of the calibration unit and the signal supplied to the other input terminal.

The first search engine (141) sets the operating characteristic of the first DA conversion compensation unit (15) and the operating characteristic of the second DA conversion compensation unit (16), in response to an output signal ("e") of the subtraction unit (140).

The second search engine (142) sets the operating characteristic of the AD conversion compensation unit (13), in response to the output signal ("e") of the subtraction unit (140) (see FIG. 1).

In another more preferred embodiment, either the A/D conversion unit (10) or the D/A conversion unit (11) generates a dither output signal for enhancing a convergence of calculation operation of the first search engine (141) and the second search engine (142) of the calibration unit (14) (see FIGS. 3, 8, 10, 11).

Figure 7:
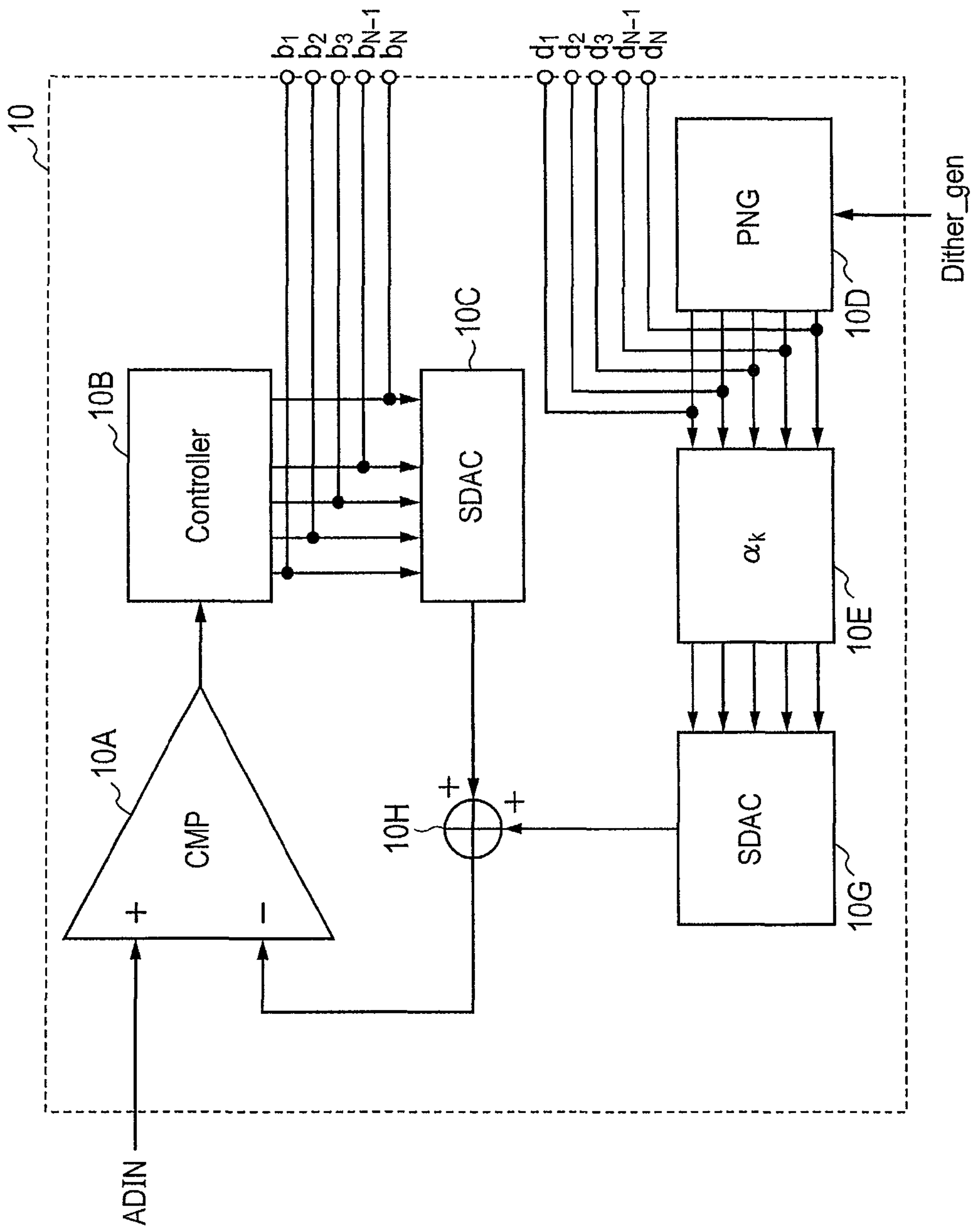
FIG. 7 is a diagram showing another configuration of the A/D conversion unit 10 for generating the AD conversion digital signal bk and the dither digital signal dk in the electronic system 1 according to the second embodiment shown in FIG. 3.

In yet another more preferred embodiment, the A/D conversion unit (10) which generates the dither output signal is comprised of either a pipeline type A/D converter (see FIG. 4) or a successive comparison type A/D converter (see FIG. 7).

In an alternative more preferred embodiment, the DA conversion compensation unit includes a first DA conversion compensation unit (15) and a second DA conversion compensation unit (16A, 16B).

During the calibration operation period, the calibration digital input signal (DAIN) is supplied to an input terminal of the first DA conversion compensation unit (15), and thereby the DA conversion compensation calibration digital output signal generated from an output terminal of the first DA conversion compensation unit (15) is supplied to the one input terminal of the calibration unit (14).

An operating characteristic of the first DA conversion compensation unit (15) set by the calibration unit (14) during the calibration operation period emulates the non-linearity of the DA conversion of the D/A conversion unit (11).

Figure 8:
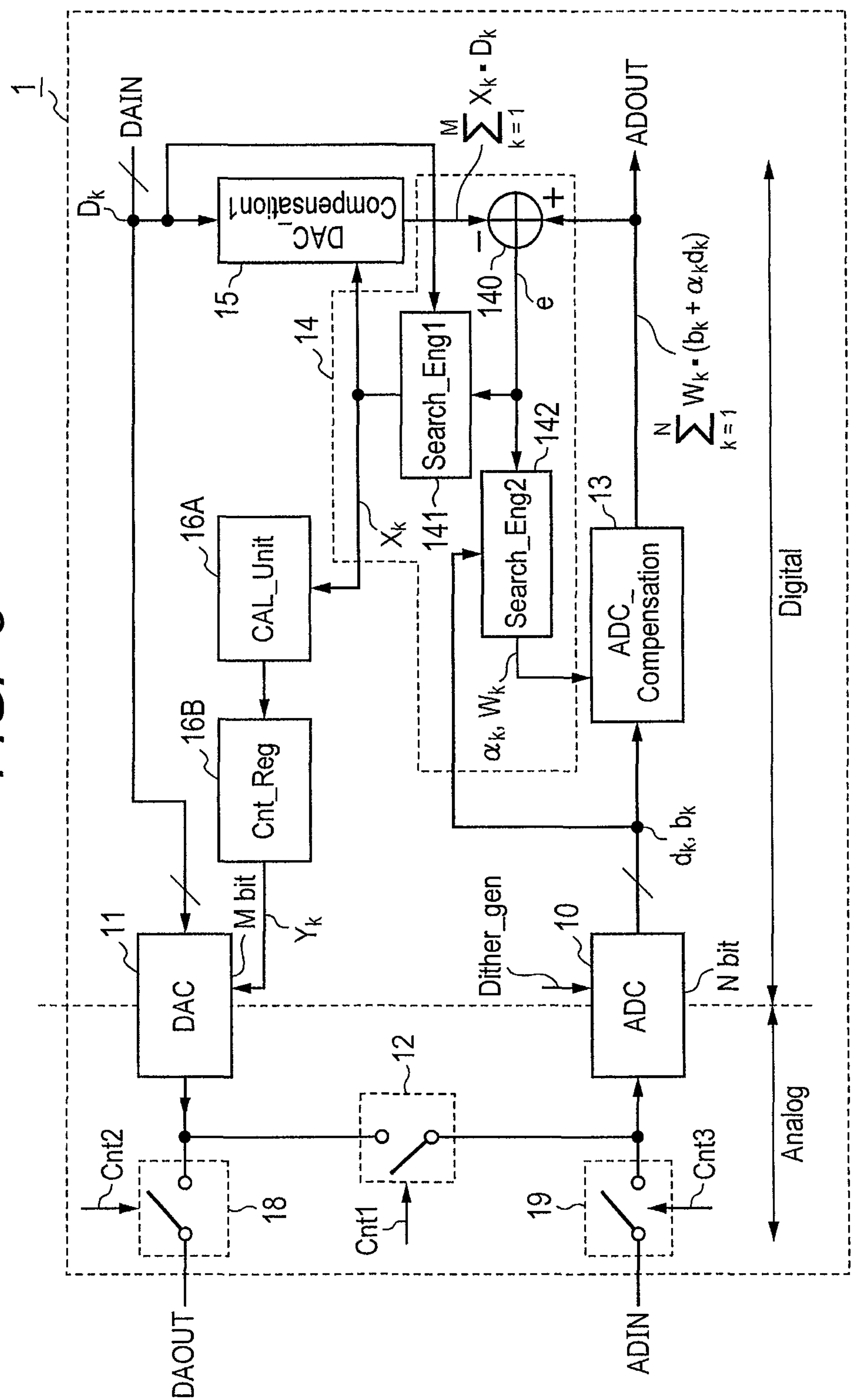
FIG. 8 is a diagram showing the configuration of an electronic system 1 according to a third embodiment.

During a normal operation period after the calibration operation period, the second DA conversion compensation unit (16A, 16B) substantially cancels the non-linearity of the DA conversion of the D/A conversion unit (11) (see FIG. 8).

In a further alternative more preferred embodiment, the D/A conversion unit (11) is comprised of a binary type D/A converter.

Figure 9:
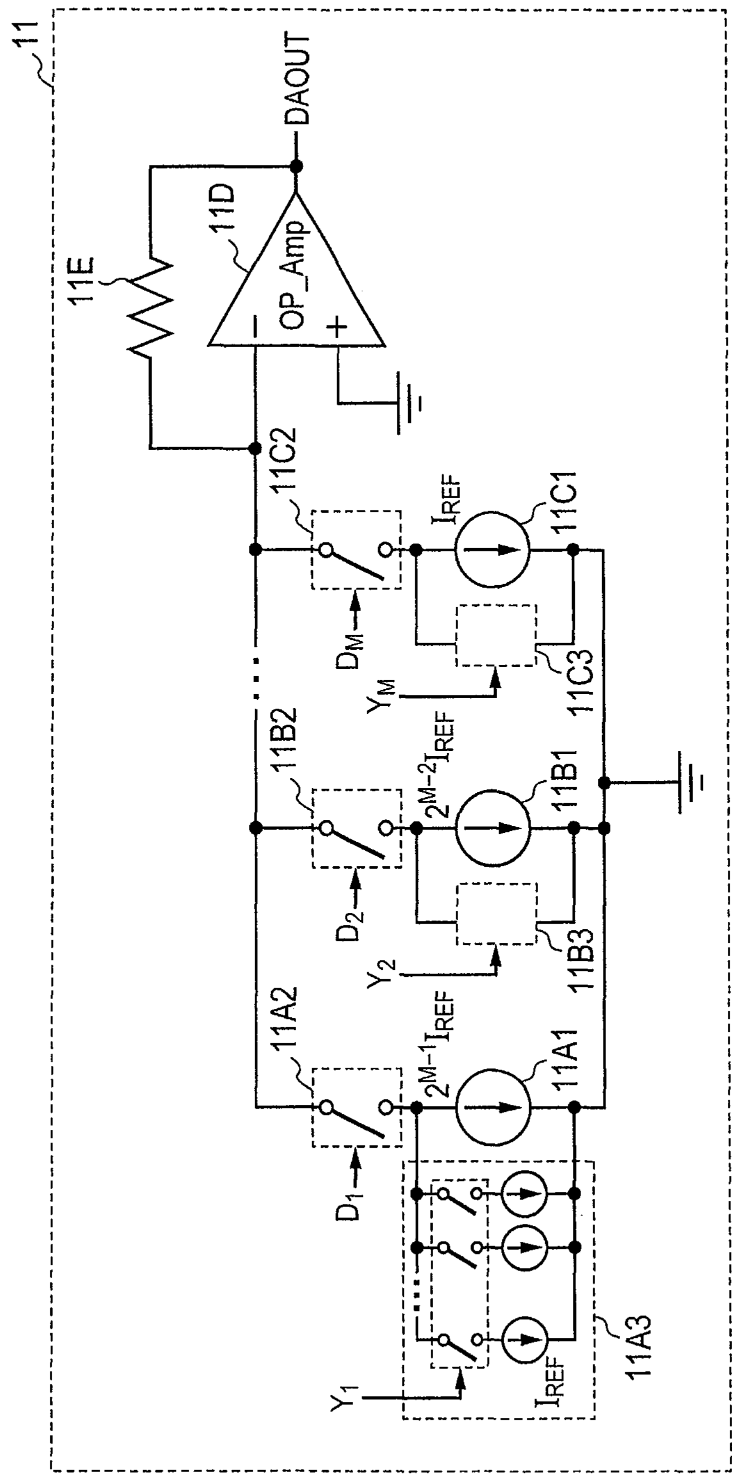
FIG. 9 is a diagram showing the configuration of a D/A conversion unit 11 whose non-linearity is compensated for by supplying a weight coefficient Yk (k=1, 2 . . . M) generated from a calibration value calculation unit 16A and a control register 16B to the D/A conversion unit 11 in the electronic system 1 according to the third embodiment shown in FIG. 8.

A weight error of the binary type D/A converter is reduced by an output signal of the second DA conversion compensation unit (16A, 16B) in order to substantially cancel the non-linearity of the DA conversion of the D/A conversion unit (11) during the normal operation period (see FIG. 9).

Figure 10:
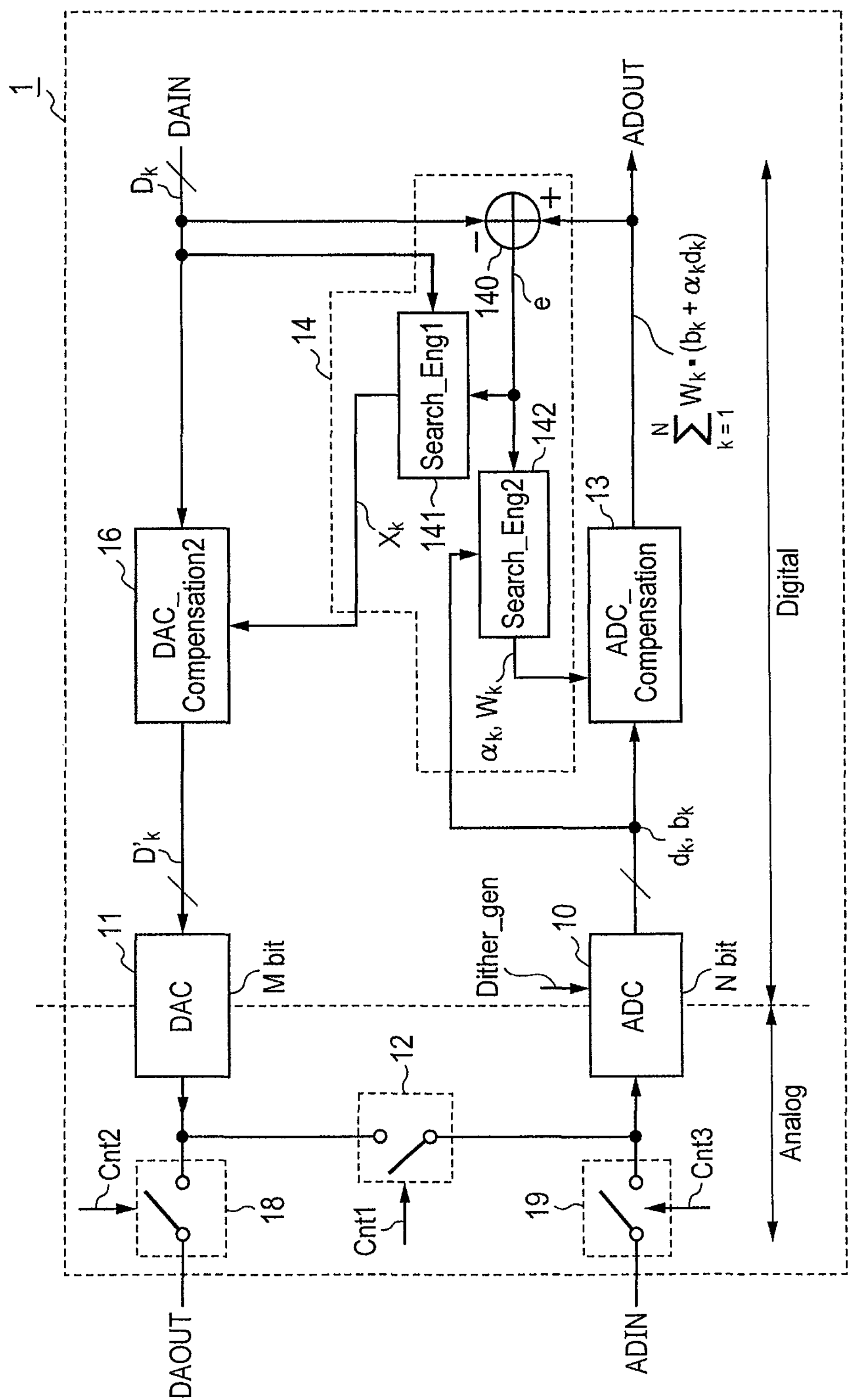
FIG. 10 is a diagram showing the configuration of an electronic system 1 according to a fourth embodiment.

In a specific embodiment, during the calibration operation period and the normal operation period, the operating characteristic of the DA conversion compensation unit (16) substantially cancels the non-linearity of the DA conversion of the DA conversion unit (11) (see FIG. 10).

Figure 11:
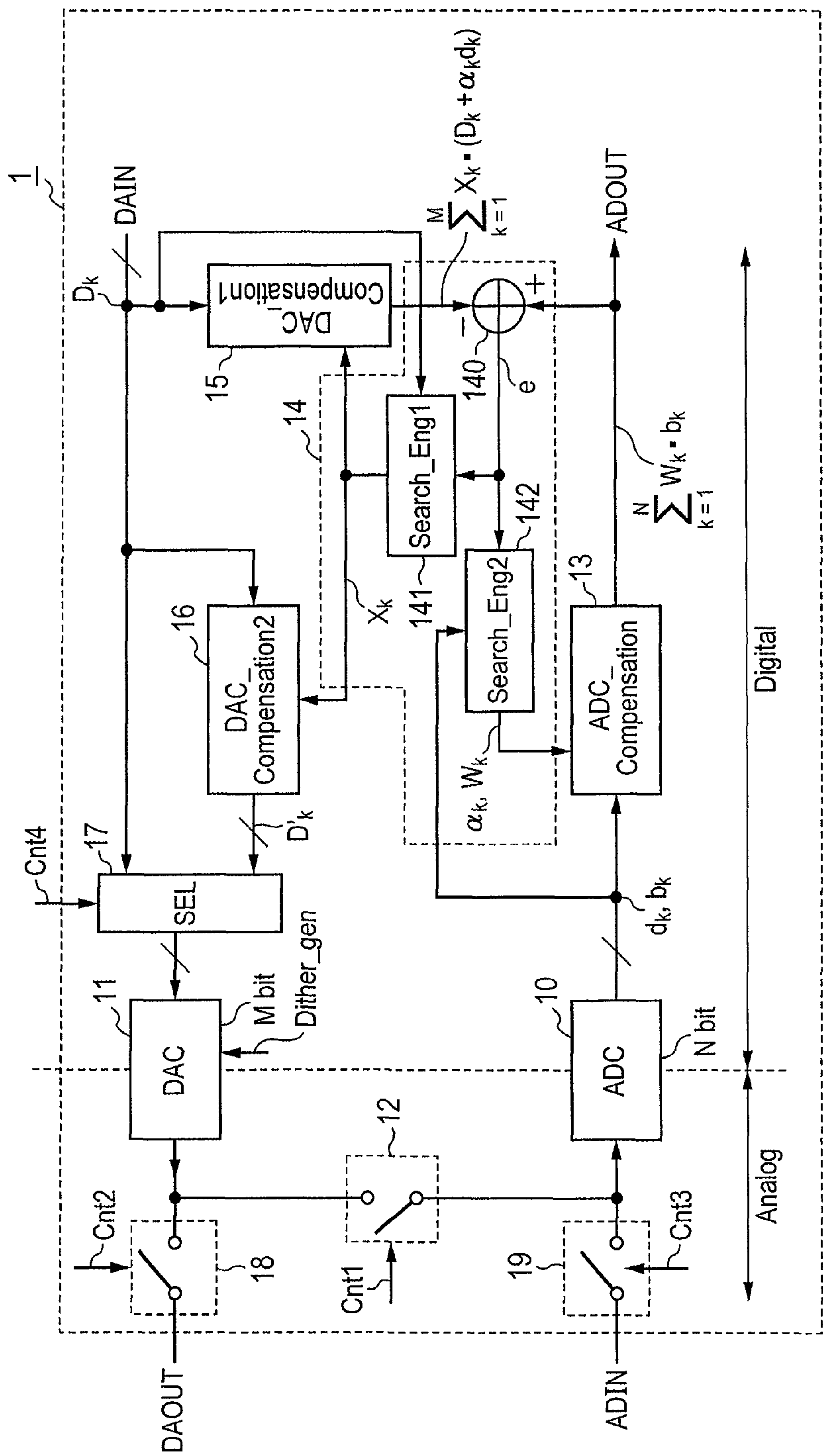
FIG. 11 is a diagram showing the configuration of an electronic system 1 according to a fifth embodiment.
Figure 12:
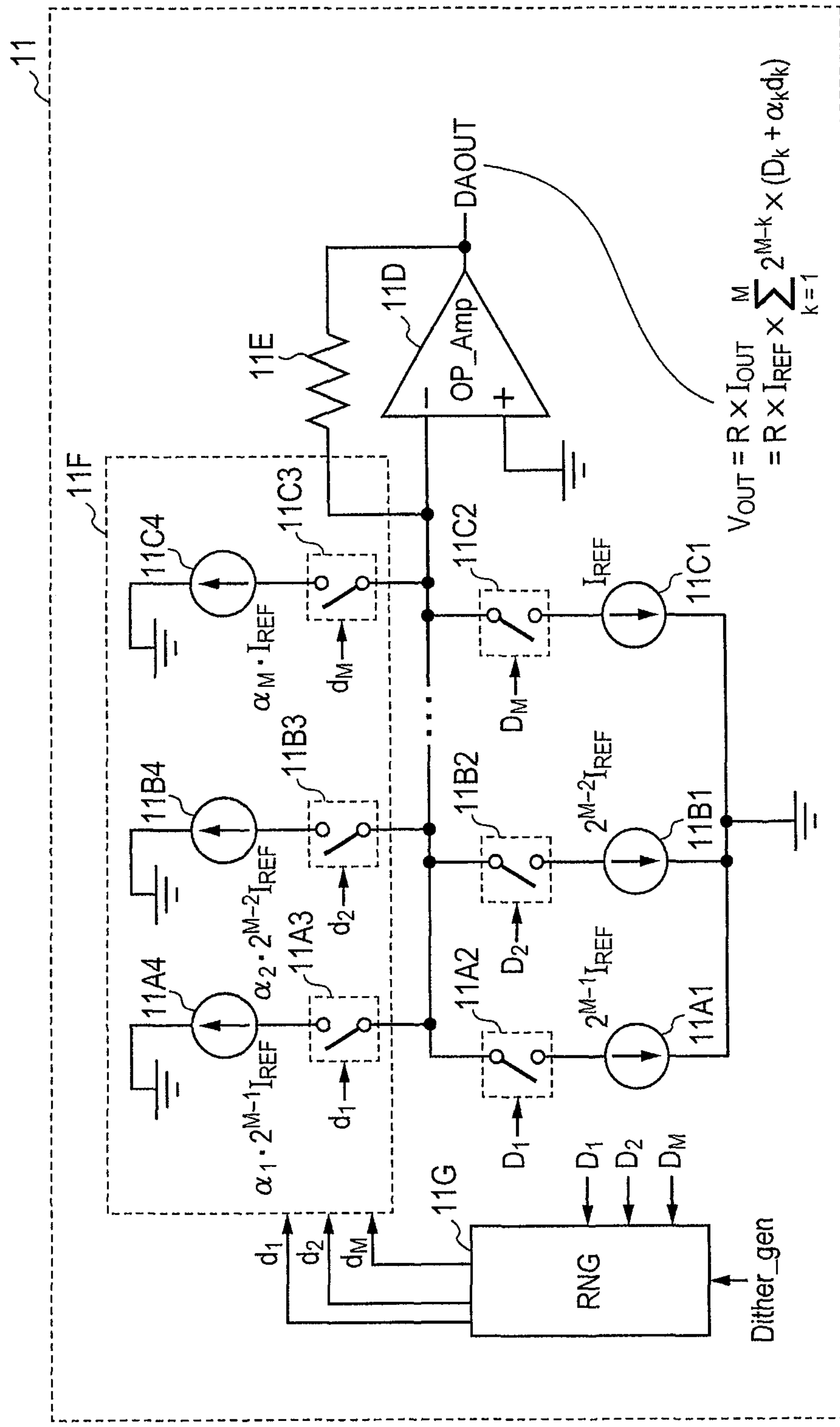
FIG. 12 is a diagram showing the configuration of the D/A conversion unit 11 for generating a dither analog output signal in response to a dither generation control signal Dither_gen in the electronic system 1 according to the fifth embodiment shown in FIG. 11.

In another specific embodiment, the DA conversion unit (11) which generates the dither output signal is comprised of a binary type D/A converter having a dither analog current generation unit for generating a dither analog output signal (see FIGS. 11, 12).

In a more specific embodiment, the A/D conversion unit (10), the D/A conversion unit (11), the AD conversion compensation unit (13), the DA conversion compensation unit (15, 16, 16A), and the calibration unit (14) in the electronic system (1) are integrated in a semiconductor integrated circuit.

In another more specific embodiment, the semiconductor integrated circuit is an RF analog semiconductor integrated circuit.

The A/D conversion unit (10) is a reception A/D converter (Rx_A/D) of the RF analog semiconductor integrated circuit, and the D/A conversion unit (11) is a transmission D/A converter (Tx_D/A) of the RF analog semiconductor integrated circuit. (see FIG. 13).

The semiconductor integrated circuit according to the most specific embodiment is a microcomputer in which a central processing unit core (1410) and an analog core (1430) are integrated.

Figure 14:
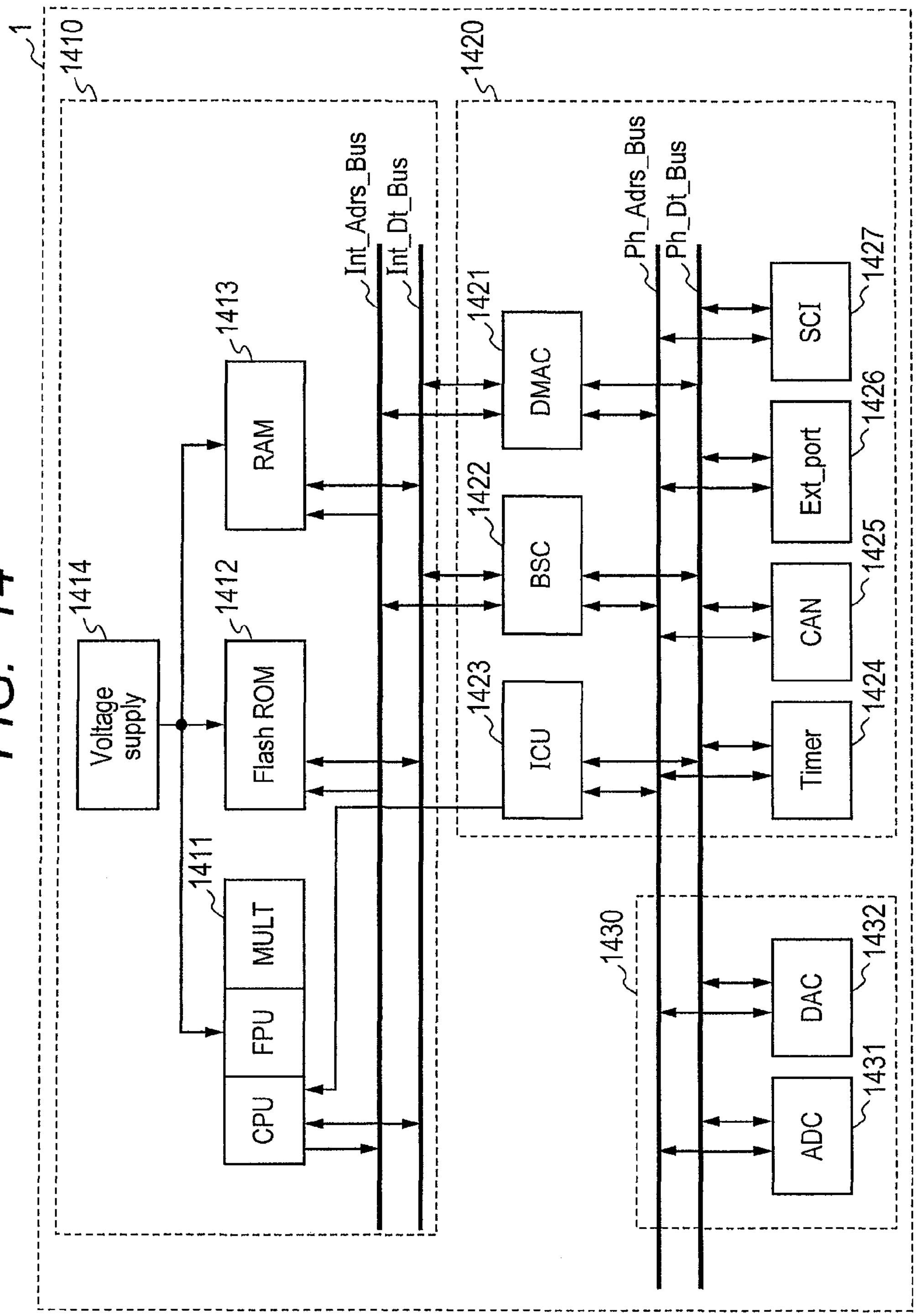
FIG. 14 is a diagram showing the configuration of a semiconductor integrated circuit 1 according to a seventh embodiment configured as a single-chip microcomputer.

The analog core (1430) includes the A/D conversion unit (10) and the D/A conversion unit (11) (see FIG. 14).

[2] Another exemplary embodiment is an operating method of an electronic system (1) including an A/D conversion unit (10), a D/A conversion unit (11), an AD conversion compensation unit (13), a DA conversion compensation unit (15, 16, 16A), and a calibration unit (14).

During a calibration operation period, a calibration digital input signal (DAIN) is supplied to the DA conversion compensation unit (15, 16, 16A), and either the calibration digital input signal (DAIN) or a DA conversion compensation calibration digital output signal generated from the DA conversion compensation unit is supplied to an input terminal of the D/A conversion unit (11).

During the calibration operation period, a calibration analog signal generated from an output terminal of the D/A conversion unit (11) can be supplied to an input terminal of the A/D conversion unit (10), and a calibration digital output signal (bk) generated from an output terminal of the A/D conversion unit (10) is supplied to an input terminal of the AD conversion compensation unit (13).

During the calibration operation period, either the calibration digital input signal or the DA conversion compensation calibration digital output signal is supplied to one input terminal of the calibration unit (14), and an AD conversion compensation calibration digital output signal generated from the AD conversion compensation unit is supplied to the other input terminal of the calibration unit (14).

During the calibration operation period, the calibration unit (14) sets an operating characteristic of the AD conversion compensation unit (13) and an operating characteristic of the DA conversion compensation unit (15, 16, 16A) in response to the signal supplied to the one input terminal and the signal supplied to the other input terminal.

The operating characteristic of the AD conversion compensation unit (13) set during the calibration operation period compensates for non-linearity of AD conversion of the A/D conversion unit (10).

The operating characteristic of the DA conversion compensation unit (15, 16, 16A) set during the calibration operation period compensates for non-linearity of DA conversion of the D/A conversion unit (11) (see FIG. 1).

According to the above embodiment, it is possible to compensate for the non-linearity of the AD conversion unit and the non-linearity of the DA conversion unit in the electronic system including the DA conversion unit and the AD conversion unit.

2. Details of Embodiments

Next, embodiments will be described in greater detail below. In all the drawings for illustrating the best mode for carrying out the invention, components having the same functions as in the foregoing drawings are denoted by the same reference numerals, and their description will not be repeated.

First Embodiment

Configuration of Electronic System

FIG. 1 is a diagram showing the configuration of an electronic system 1 according to the first embodiment.

The electronic system 1 according to the first embodiment shown in FIG. 1 is comprised of a monolithic semiconductor integrated circuit. An A/D conversion unit 10, a D/A conversion unit 11, a calibration switch 12, an AD conversion compensation unit 13, a calibration unit 14, a first DA conversion compensation unit 15, a second DA conversion compensation unit 16, a selector unit 17, a DA conversion output switch 18, and an AD conversion input switch 19 are integrated over a semiconductor chip of the monolithic semiconductor integrated circuit. The electronic system 1 according to the first embodiment shown in FIG. 1 operates as the foreground digital correction type A/D converter described at the beginning of this specification. Further, the calibration unit 14 includes a subtraction unit 140, a first search engine 141, and a second search engine 142. Accordingly, an output section of the D/A conversion unit 11, the DA conversion output switch 18, the calibration switch 12, an input section of the A/D conversion unit 10, and the AD conversion input switch 19 configure an analog circuit section Analog of the electronic system 1. On the other hand, an input section of the D/A conversion unit 11, the selector unit 17, the second DA conversion compensation unit 16, the first DA conversion compensation unit 15, the calibration unit 14, the AD conversion compensation unit 13, and an output section of the A/D conversion unit 10 configure a digital circuit section Digital of the electronic system 1.

Calibration Operation

During a calibration operation period, a digital input signal DAIN as a calibration digital signal is supplied via a first input terminal and an output terminal of the selector unit 17 to an input terminal of the D/A conversion unit 11 which functions as a reference D/A conversion unit. Accordingly, a DA conversion analog output signal DAOUT which is a calibration analog signal generated from an output terminal of the D/A conversion unit 11 as the reference D/A conversion unit is supplied to an input terminal of the A/D conversion unit 10 via the calibration switch 12. As a result, an AD conversion digital signal generated from an output terminal of the A/D conversion unit 10 is supplied to an input terminal of the AD conversion compensation unit 13 which functions as a compensation digital output generation unit, and an AD conversion compensation digital output signal is generated from an output terminal of the AD conversion compensation unit 13. Further, during the calibration operation period, the digital input signal DAIN functioning as the calibration digital signal is supplied to an input terminal of the first DA conversion compensation unit 15, and a DA conversion compensation calibration digital output signal is generated from an output terminal of the first DA conversion compensation unit 15.

As a result, during the calibration operation period, the calibration unit 14 operates so that the difference between the DA conversion compensation calibration digital output signal from the first DA conversion compensation unit 15 and the AD conversion compensation digital output signal from the AD conversion compensation unit 13 supplied to the subtraction unit 140 of the calibration unit 14 becomes substantially zero. That is, the first search engine 141 and the second search engine 142 respond to an error output signal "e" of the subtraction unit 140 of the calibration unit 14, so that an operating characteristic of the first DA conversion compensation unit 15 and an operating characteristic of the AD conversion compensation unit 13 are determined. More specifically, the operating characteristic of the first DA conversion compensation unit 15 is determined by the first search engine 141 so as to emulate the non-linearity of DA conversion of the D/A conversion unit 11 as the reference D/A conversion unit, and the operating characteristic of the AD conversion compensation unit 13 is determined by the second search engine 142 so as to cancel the non-linearity of AD conversion of the A/D conversion unit 10. That is, the operating characteristic of the AD conversion compensation unit 13 corresponds to the reverse direction conversion of the non-linearity of AD conversion of the A/D conversion unit 10, whereas the operating characteristic of the first DA conversion compensation unit 15 corresponds to the forward direction conversion of the non-linearity of DA conversion of the D/A conversion unit 11. Accordingly, the first search engine 141 and the second search engine 142 respond to the error output signal "e" of the subtraction unit 140 of the calibration unit 14, so that a weight coefficient Xk (k=1, 2 . . . M) of the first DA conversion compensation unit 15 is determined by the first search engine 141, and a weight coefficient Wk (k=1, 2 . . . N) of the AD conversion compensation unit 13 is determined by the second search engine 142.

Therefore, even though the low-precision D/A conversion unit 11 and the low-precision A/D conversion unit 10 are used in the electronic system 1 according to the first embodiment shown in FIG. 1, the non-linearity of the D/A conversion unit 11 and the non-linearity of the A/D conversion unit 10 are compensated for by the operating characteristic of the first DA conversion compensation unit 15 and the operating characteristic of the AD conversion compensation unit 13 respectively during the calibration operation period.

Since the first search engine 141 of the calibration unit 14 determines the weight coefficient Xk (k=1, 2 . . . M) of the first DA conversion compensation unit 15 in response to the error output signal "e" of the subtraction unit 140, the DA conversion compensation calibration digital output signal DAC_Cmp1_OUT generated from the output terminal of the first DA conversion compensation unit 15 is expressed by the following equation (1).

$$\text{DAC\_Cmp1\_OUT} = \sum_{k=1}^{M} X_k \cdot D_k \tag{1}$$

In the equation (1), Dk (k=1, 2 . . . M) denotes the M-bit digital input signal DAIN as the calibration digital signal supplied to the first DA conversion compensation unit 15 and the selector unit 17 during the calibration operation period.

Since the second search engine 142 of the calibration unit 14 determines the weight coefficient Wk (k=1, 2 . . . N) of the AD conversion compensation unit 13 in response to the error output signal "e" of the subtraction unit 140, the AD conversion compensation digital output signal ADC_Cmp_OUT generated from the output terminal of the AD conversion compensation unit 13 is expressed by the following equation (2).

$$\text{ADC\_Cmp\_OUT} = \sum_{k=1}^{N} W_k \cdot b_k \tag{2}$$

In the equation (2), bk (k=1, 2 . . . N) denotes the N-bit AD conversion digital signal bk generated from the output terminal of the A/D conversion unit 10 during the calibration operation period.

By performing a calibration operation during the calibration operation period, the error output signal "e" of the subtraction unit 140 of the calibration unit 14 becomes substantially zero. For example, by an LMS (Least Mean Square) algorithm described in Non-patent Document 1, the weight coefficient Xk (k=1, 2 . . . M) of the first DA conversion compensation unit 15 and the weight coefficient Wk (k=1, 2 . . . N) of the AD conversion compensation unit 13 are determined. Consequently, even though the low-precision D/A conversion unit 11 and the low-precision A/D conversion unit 10 are used in the electronic system 1 according to the first embodiment shown in FIG. 1, the non-linearity of the D/A conversion unit 11 and the non-linearity of the A/D conversion unit 10 are compensated for by the operating characteristic of the first DA conversion compensation unit 15 and the operating characteristic of the AD conversion compensation unit 13 respectively during the calibration operation period.

Further, by performing the calibration operation during the calibration operation period, the weight coefficient Xk (k=1, 2 . . . M) of the first DA conversion compensation unit 15 calculated by the first search engine 141 of the calibration unit 14 is also stored in an internal register of the second DA conversion compensation unit 16.

Normal Operation

As a result, during a normal operation period after the calibration operation period, the second DA conversion compensation unit 16 determines an operating characteristic of the second DA conversion compensation unit 16 by using the weight coefficient Xk (k=1, 2 . . . M) of the first DA conversion compensation unit 15 stored in the internal register. That is, the operating characteristic of the second DA conversion compensation unit 16 corresponds to the reverse direction conversion of the non-linearity of DA conversion of the D/A conversion unit 11. As a result, the operating characteristic of the second DA conversion compensation unit 16 cancels the non-linearity of DA conversion of the D/A conversion unit 11.

More specifically, during the normal operation period after the calibration operation period, the second DA conversion compensation unit 16 generates a compensation digital value D'k (k=1, 2 . . . M) by using the digital value Dk (k=1, 2 . . . M) of the DA conversion digital input signal DAIN and the weight coefficient Xk (k=1, 2 . . . M) stored in the internal register. The compensation digital value D'k (k=1, 2 . . . M) generated from the output terminal of the second DA conversion compensation unit 16 is supplied to a second input terminal of the selector unit 17. That is, the compensation digital value D'k (k=1, 2 . . . M) from the second DA conversion compensation unit 16 is generated by reverse direction conversion of the digital value Dk (k=1, 2 . . . M) of the DA conversion digital input signal DAIN by the non-linearity of DA conversion of the D/A conversion unit 11. Therefore, during the normal operation period, the operating characteristic of the second DA conversion compensation unit 16 cancels the non-linearity of DA conversion of the D/A conversion unit 11; therefore, even though the low-precision D/A conversion unit 11 is used, the high-precision DA conversion analog output signal DAOUT can be generated via the DA conversion output switch 18 from the output terminal of the D/A conversion unit 11.

Further, during the normal operation period after the calibration operation period, the non-linearity of the A/D conversion unit 10 is compensated for by the operating characteristic of the AD conversion compensation unit 13, as during the calibration operation period. That is, the operating characteristic of the AD conversion compensation unit 13 determined by the second search engine 142 cancels the non-linearity of AD conversion of the A/D conversion unit 10. Therefore, even though the low-precision A/D conversion unit 10 is used, the high-precision AD conversion digital output signal ADOUT can be generated from the output terminal of the AD conversion compensation unit 13.

Figure 2:
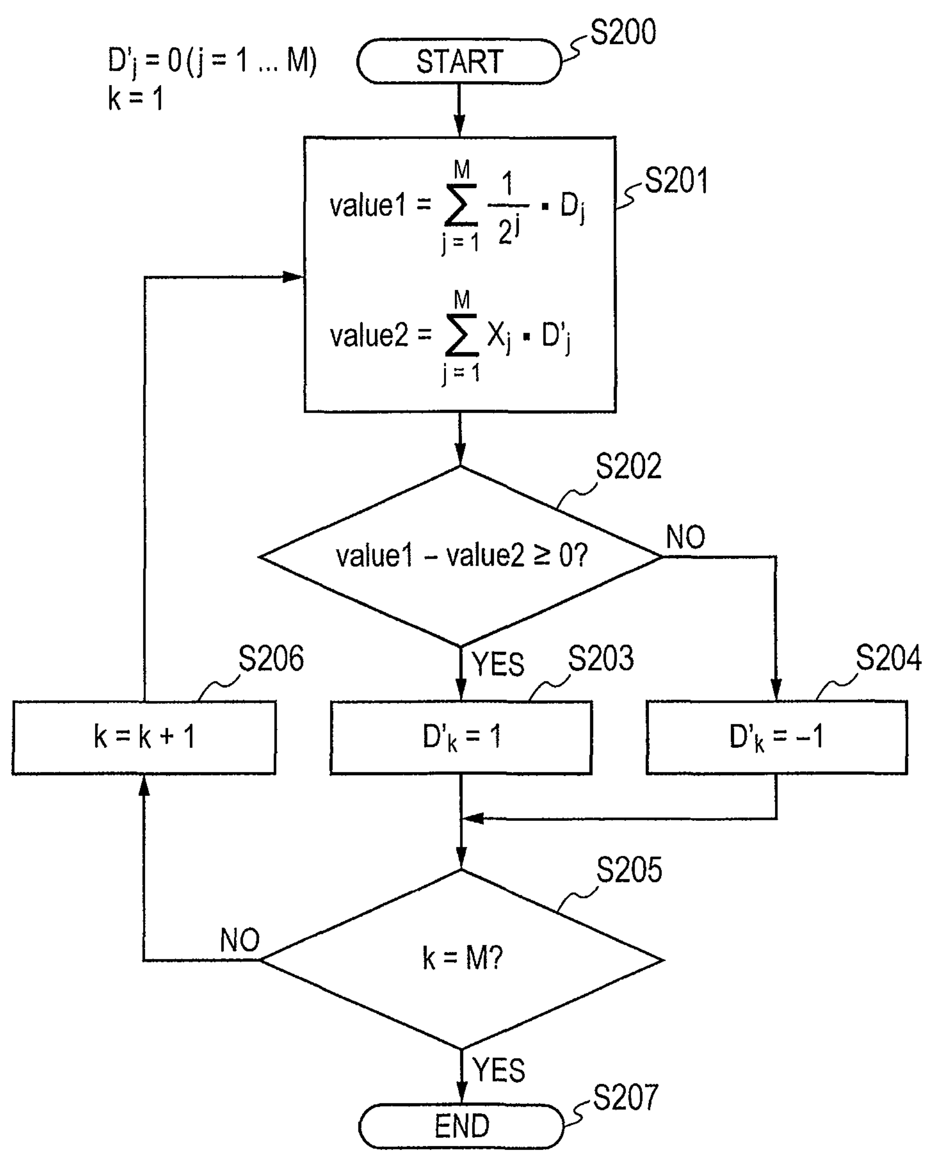
FIG. 2 is a flowchart for explaining an operation in which a second DA conversion compensation unit 16 in the electronic system 1 according to the first embodiment shown in FIG. 1 generates a compensation digital value D'j (j=1, 2 . . . M) in response to a digital value Dj (j=1, 2 . . . M) of a DA conversion digital input signal DAIN.

Generation of Compensation Digital Value of Second DA Conversion Compensation Unit FIG. 2 is a flowchart for explaining an operation in which the second DA conversion compensation unit 16 in the electronic system 1 according to the first embodiment shown in FIG. 1 generates the compensation digital value D'j (j=1, 2 . . . M) in response to the digital value Dj (j=1, 2 . . . M) of the DA conversion digital input signal DAIN.

In a first step S200 of FIG. 2, the operation of the second DA conversion compensation unit 16 is started, where k=1 and D'j (j=1, 2 . . . M)=0 are initially set. In a second step S201, the second DA conversion compensation unit 16 calculates an ideal value Value1 of the DA conversion analog output signal DAOUT generated from the output terminal of the D/A conversion unit 11, in accordance with the following equation (3).

$$\text{Value 1} = \sum_{j=1}^{M} \frac{1}{2^j} \cdot D_j \tag{3}$$

Further, in the second step S201, the second DA conversion compensation unit 16 calculates an actual value Value2 of the DA conversion analog output signal DAOUT generated from the output terminal of the D/A conversion unit 11, in accordance with the following equation (4).

$$\text{Value 2} = \sum_{j=1}^{M} X_j \cdot D'_j \tag{4}$$

In a third step S202, the second DA conversion compensation unit 16 performs a determination operation in accordance with the following equation (5).

$$\text{Value1} - \text{Value2} \geq 0? \tag{5}$$

If a determination result in the third step S202 is "YES", the actual value Value2 of the DA conversion analog output signal DAOUT generated from the D/A conversion unit 11 calculated by the equation (4) is smaller than the ideal value Value1 of the DA conversion analog output signal DAOUT generated from the D/A conversion unit 11 calculated by the equation (3). Accordingly, if the determination result in the third step S202 is "YES", the second DA conversion compensation unit 16 sets the compensation digital value D'k to a positive value "1" in a fourth step S203 so that the actual value Value2 increases to the ideal value Value1.

On the other hand, if the determination result in the third step S202 is "NO", the actual value Value2 of the DA conversion analog output signal DAOUT generated from the D/A conversion unit 11 calculated by the equation (4) is larger than the ideal value Value1 of the DA conversion analog output signal DAOUT generated from the D/A conversion unit 11 calculated by the equation (3). Accordingly, if the determination result in the third step S202 is "NO", the second DA conversion compensation unit 16 sets the compensation digital value D'k to a negative value "−1" in a fifth step S204 so that the actual value Value2 decreases to the ideal value Value1.

In a sixth step S205 after the fourth step S203 or the fifth step S204, the second DA conversion compensation unit 16 determines whether or not a bit management number k reaches the number of bits M. If a determination result in the sixth step S205 is "NO", the bit management number k is incremented by +1 in a seventh step S206. If the determination result in the sixth step S205 is "YES", the operation of the second DA conversion compensation unit 16 is ended in an eighth step S206.

From the operation of generating the compensation digital value D'k by the second DA conversion compensation unit 16 shown in FIG. 2, by M loop operations, the most significant bit D'1, the second bit D'2, . . . , the least significant bit D'M of the compensation digital value D'k (k=1, 2 . . . M) are sequentially generated by the second DA conversion compensation unit 16. During this sequential generation, the digital value Dk (k=1, 2 . . . M) of the M-bit DA conversion digital input signal DAIN and the M-bit weight coefficient Xk (k=1, 2 . . . M) from the first search engine 141 are supplied in M-bit parallel to the second DA conversion compensation unit 16. It can be considered that in such a state where the digital value Dk of the M-bit DA conversion digital input signal DAIN and the M-bit weight coefficient Xk are supplied in parallel to the second DA conversion compensation unit 16, the second DA conversion compensation unit 16 sequentially generates the M-bit compensation digital value D'k. In this consideration, the second DA conversion compensation unit 16 operates at least M times faster than the D/A conversion unit 11 and the selector unit 17.

A first control signal Cnt1 is supplied to the calibration switch 12, a second control signal Cnt2 is supplied to the DA conversion output switch 18, a third control signal Cnt3 is supplied to the AD conversion input switch 19, and a fourth control signal Cnt4 is supplied to the selector unit 17.

During the calibration operation period, the fourth control signal Cnt4 is at a high level, so that the selector unit 17 selects the digital input signal DAIN as the calibration digital signal supplied to the first input terminal and supplies it to the input terminal of the D/A conversion unit 11.

During the normal operation period, the fourth control signal Cnt4 is at a low level, so that the selector unit 17 selects the compensation digital value D'k (k=1, 2 . . . M) supplied to the second input terminal from the second DA conversion compensation unit 16 and supplies it to the input terminal of the D/A conversion unit 11.

Further, during the calibration operation period, the first control signal Cnt1 is at the high level, and the second control signal Cnt2 and the third control signal Cnt3 are at the low level, so that the calibration switch 12 is turned on, and the DA conversion output switch 18 and the AD conversion input switch 19 are turned off.

Further, during the normal operation period, the first control signal Cnt1 is at the low level, and the second control signal Cnt2 and the third control signal Cnt3 are at the high level, so that the calibration switch 12 is turned off, and the DA conversion output switch 18 and the AD conversion input switch 19 are turned on.

Second Embodiment

Configuration of Electronic System

Figure 3:
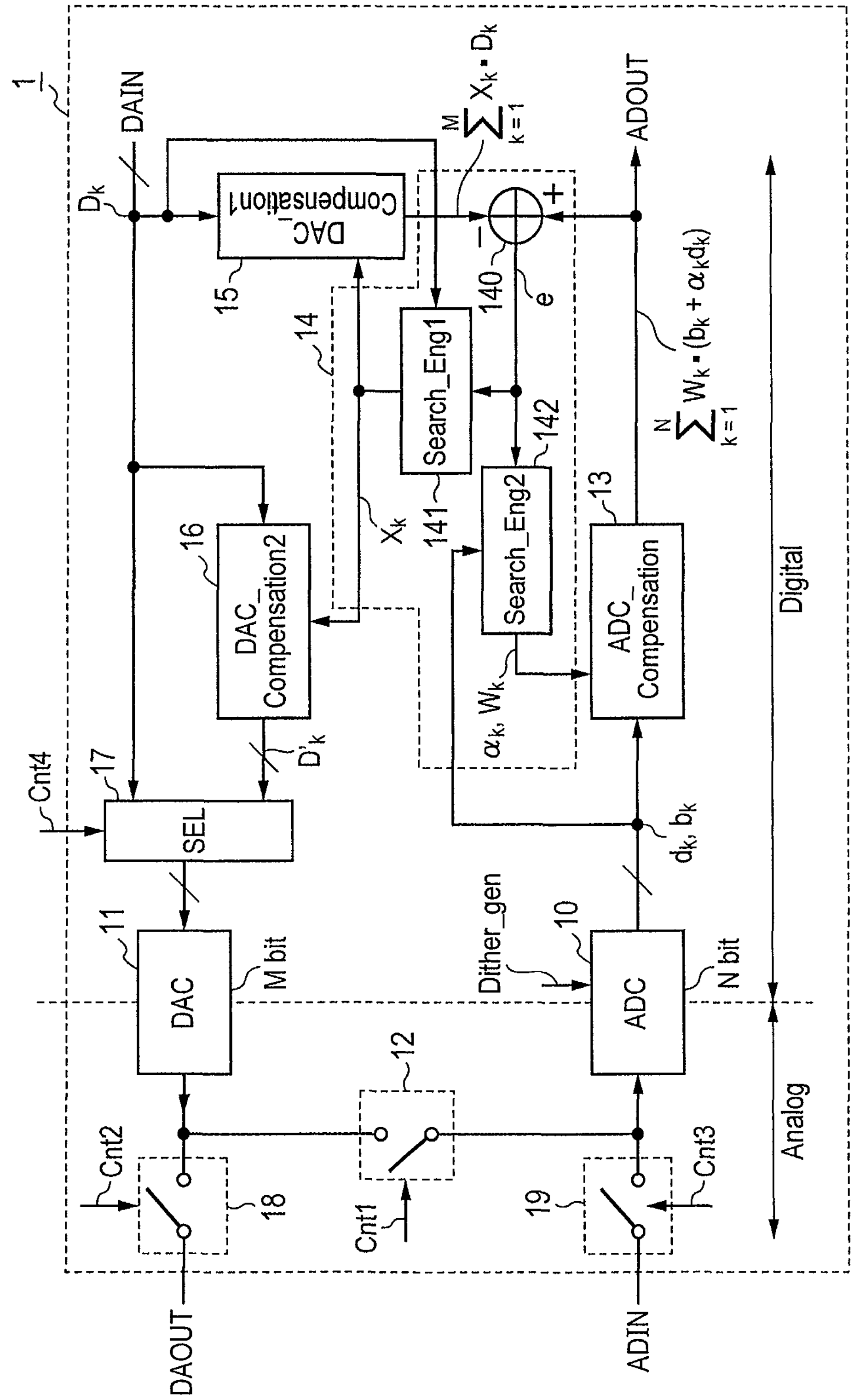
FIG. 3 is a diagram showing the configuration of an electronic system 1 according to a second embodiment.

FIG. 3 is a diagram showing the configuration of an electronic system 1 according to the second embodiment.

The electronic system 1 according to the second embodiment shown in FIG. 3 differs from the electronic system 1 according to the first embodiment shown in FIG. 1 in the following respect.

That is, in the electronic system 1 according to the second embodiment shown in FIG. 3, the A/D conversion unit 10 generates not only the N-bit AD conversion digital signal bk, but also a N-bit dither digital signal dk in response to a dither generation control signal Dither_gen. Accordingly, the second search engine 142 of the calibration unit 14 generates not only the N-bit weight coefficient Xk but also another N-bit weight coefficient αk.

Thus, in the electronic system 1 according to the second embodiment shown in FIG. 3, the A/D conversion unit 10 generates the dither digital signal dk, and the second search engine 142 generates the N-bit weight coefficient αk, in order to improve the convergence speed of weight calculation performed by the first search engine 141 and the second search engine 142 of the calibration unit 14.

On the other hand, the A/D conversion unit 10 of the electronic system 1 according to the first embodiment shown in FIG. 1 does not generate the dither digital signal dk. As a result, the study made by the present inventors et al. has revealed that a problem that the convergence speed of weight calculation performed by the first search engine 141 and the second search engine 142 of the calibration unit 14 is slow in the case where the DA conversion analog output signal DAOUT of the D/A conversion unit 11 of the electronic system 1 according to the first embodiment shown in FIG. 1 is a DC voltage or a low-frequency voltage.

Accordingly, in order to resolve the problem that the convergence speed of weight calculation is slow in the electronic system 1 according to the first embodiment of FIG. 1; in the electronic system 1 according to the second embodiment shown in FIG. 3, the A/D conversion unit 10 generates the N-bit dither digital signal dk in response to the dither generation control signal Dither_gen, and the second search engine 142 generates the N-bit weight coefficient αk.

That is, the N-bit AD conversion digital signal bk generated from the output terminal of the A/D conversion unit 10 is assumed to be e.g. all "0" since the DA conversion analog output signal DAOUT of the D/A conversion unit 11 of the electronic system 1 according to the first embodiment of FIG. 1 is the DC voltage or the low-frequency voltage. In this case, the AD conversion compensation digital output signal ADC_Cmp_OUT expressed by the equation (2) from the output terminal of the AD conversion compensation unit 13 is all "0", entirely regardless of the value of the weight coefficient Wk (k=1, 2 . . . N) of the AD conversion compensation unit 13. Therefore, the weight calculation of the weight coefficient Wk (k=1, 2 . . . N) of the AD conversion compensation unit 13 performed by the second search engine 142 of the calibration unit 14 does not converge correctly. Further, due to this, the weight calculation of the weight coefficient Xk (k=1, 2 . . . M) of the first DA conversion compensation unit 15 performed by the first search engine 141 of the calibration unit 14 does not converge correctly either.

On the other hand, in the electronic system 1 according to the second embodiment shown in FIG. 3, even in the above case, the N-bit dither digital signal dk generated from the A/D conversion unit 10 resolves all "0" of the AD conversion compensation digital output signal ADC_Cmp_OUT generated from the output terminal of the AD conversion compensation unit 13. Consequently, it becomes possible to correctly converge the weight calculation of the weight coefficient Wk (k=1, 2 . . . N) of the AD conversion compensation unit 13 performed by the second search engine 142 of the calibration unit 14. Further, it also becomes possible to correctly converge the weight calculation of the weight coefficient Xk (k=1, 2 . . . M) of the first DA conversion compensation unit 15 performed by the first search engine 141 of the calibration unit 14.

Configuration of A/D Conversion Unit

Figure 4:
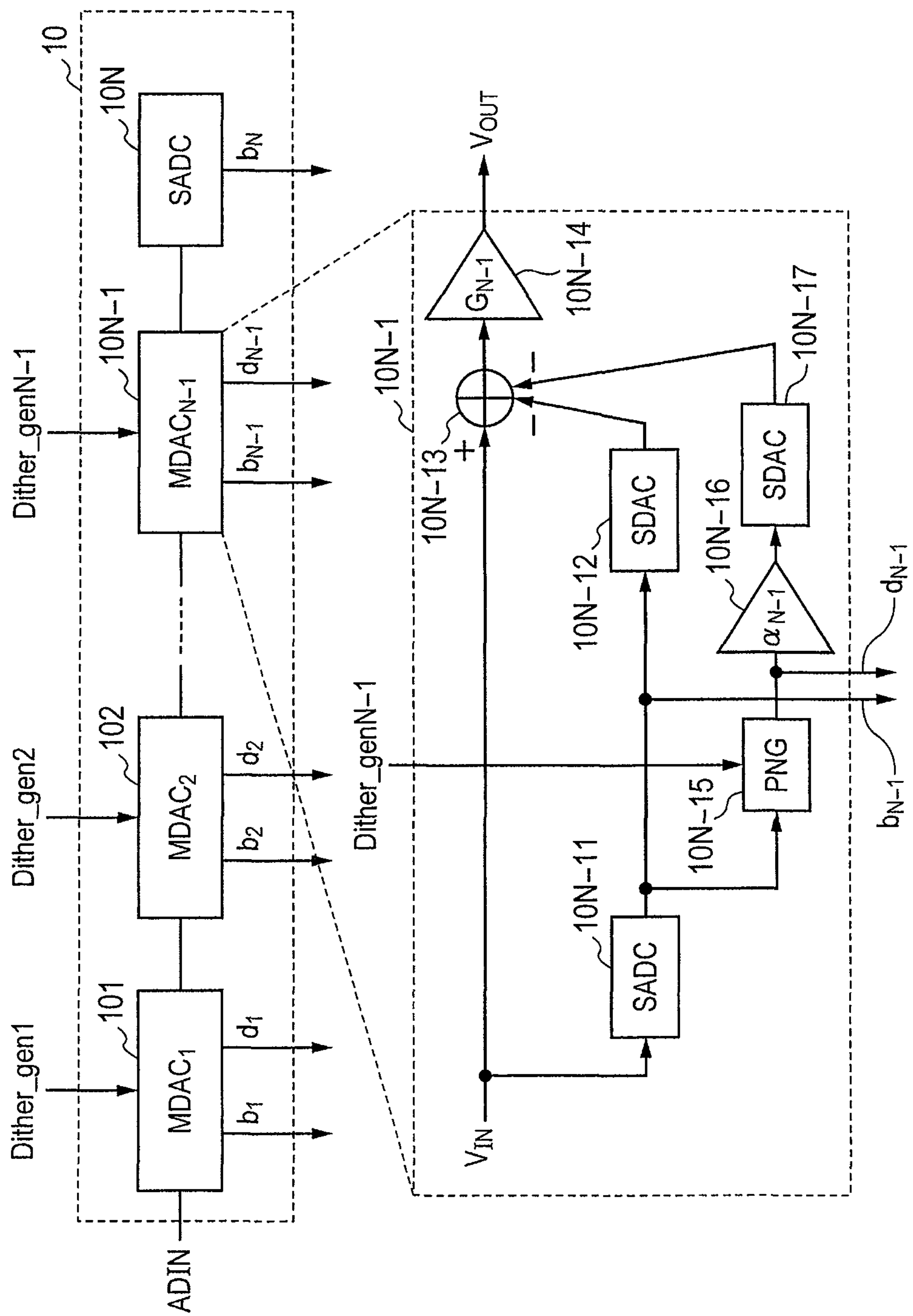
FIG. 4 is a diagram showing the configuration of an A/D conversion unit 10 for generating an AD conversion digital signal bk and a dither digital signal dk in the electronic system 1 according to the second embodiment shown in FIG. 3.

FIG. 4 is a diagram showing the configuration of the A/D conversion unit 10 for generating the AD conversion digital signal bk and the dither digital signal dk in the electronic system 1 according to the second embodiment shown in FIG. 3.

As shown in FIG. 4, the A/D conversion unit 10 is comprised of a pipeline type A/D converter including a plurality of cascaded AD conversion stages 101, 102, . . . , 10N-1, 10N as is well known. First, an analog input voltage VIN as an analog input signal ADIN and a dither generation control signal Dither_gen1 are supplied to a first AD conversion stage 101, so that the most significant bit b1 of the N-bit AD conversion digital signal bk and the most significant bit d1 of the N-bit dither digital signal dk are generated from the first AD conversion stage 101. Further, an analog residual signal generated from an output terminal of the first AD conversion stage 101 is supplied to an input terminal of a second AD conversion stage 102, as an analog input voltage VIN. A dither generation control signal Dither_gen2 is supplied to the second AD conversion stage 102, so that the second bit b2 of the N-bit AD conversion digital signal bk and the second bit d2 of the N-bit dither digital signal dk are generated from the second AD conversion stage 102. Similarly, a dither generation control signal Dither_genN−1 is supplied to the (N−1)th AD conversion stage 10N-1, so that the (N−1)th bit $b_{N-1}$ of the N-bit AD conversion digital signal bk and the (N−1)th bit $d_{N-1}$ of the N-bit dither digital signal dk are generated from the (N−1)th AD conversion stage 10N-1.

FIG. 4 also shows the configuration of each cascaded AD conversion stage 101, 102, . . . , 10N-1, 10N. As shown in FIG. 4, each AD conversion stage includes a sub-A/D converter 10N-11, a sub-D/A converter 10N-12, a subtracter 10N-13, and an amplifier 10N-14. For example, in an example of the (N−1)th stage, the analog input voltage VIN is converted to a 1.5-bit AD conversion digital signal $b_{N-1}$ by the sub-A/D converter 10N-11, and the 1.5-bit AD conversion digital signal $b_{N-1}$ is converted to an analog output signal by the sub-D/A converter 10N-12. In the subtracter 10N-13, the analog output signal of the sub-D/A converter 10N-12 is subtracted from the analog input voltage VIN. The differential output signal of the subtracter 10N-13 is amplified by the amplifier 10N-14 having a voltage gain of approximately "2", and an analog residual signal $V_{out}$ generated from an output terminal of the amplifier 10N-14 is supplied to an input terminal of the next AD conversion stage.

The (N−1)th AD conversion stage shown in FIG. 4 includes a pseudorandom number generator 10N-15, a digital multiplier 10N-16, and a second sub-D/A converter 10N-17, in order to generate the (N−1)th bit $d_{N-1}$ of the N-bit dither digital signal dk in response to the 1.5-bit AD conversion digital signal $b_{N-1}$ and the dither generation control signal Dither_genN−1. The pseudorandom number generator 10N-15 generates a 1.5-bit dither digital signal $d_{N-1}$ in response to the dither generation control signal Dither_genN−1 and the 1.5-bit AD conversion digital signal $b_{N-1}$ generated from the output terminal of the sub-A/D converter 10N-11. The digital multiplier 10N-16 multiplies the (N−1)th bit $d_{N-1}$ by a predetermined digital multiplier coefficient $\alpha_{N-1}$. The second sub-D/A converter 10N-17 converts the digital multiplication output signal of the digital multiplier 10N-16 into a dither analog output signal. In the subtracter 10N-13, the dither analog output signal is further subtracted from the analog input voltage VIN.

Operation of Sub-A/D Converter

Figure 5:
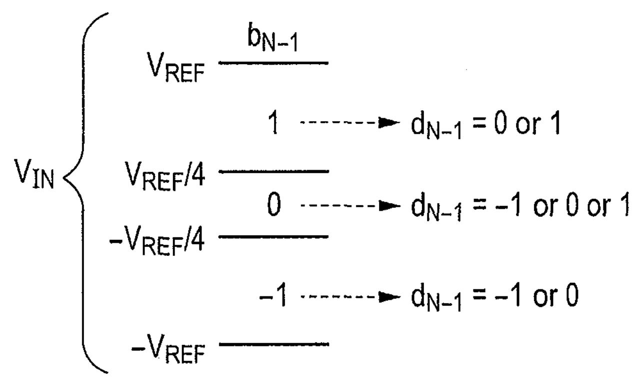
FIG. 5 is a diagram for explaining the operation of generating the AD conversion digital signal $b_{N-1}$ and the dither digital signal $d_{N-1}$ of the (N−1)th AD conversion stage 10N-1 in a pipeline type A/D converter according to the second embodiment shown in FIG. 4.

FIG. 5 is a diagram for explaining the operation of generating the AD conversion digital signal $b_{N-1}$ and the dither digital signal $d_{N-1}$ of the (N−1)th AD conversion stage 10N-1 in the pipeline type A/D converter according to the second embodiment shown in FIG. 4.

First, there is illustrated in FIG. 5 the conversion operation of the analog input voltage VIN into the 1.5-bit AD conversion digital signal $b_{N-1}$ by the sub-A/D converter 10N-11 included in the (N−1)th AD conversion stage 10N-1 of the pipeline type A/D converter according to the second embodiment shown in FIG. 4.

As shown in FIG. 5, the analog input voltage VIN is sorted by the sub-A/D converter 10N-11 into three voltage ranges: high-, medium-, and low-voltage ranges. That is, the high-voltage range is defined as a voltage range between a positive reference voltage $V_{REF}$ and a positive ¼ reference voltage $V_{REF}/4$, the medium-voltage range is defined as a voltage range between the positive ¼ reference voltage $V_{REF}/4$ and a negative ¼ reference voltage $-V_{REF}/4$, and the low-voltage range is defined as a voltage range between the negative ¼ reference voltage $-V_{REF}/4$ and a negative reference voltage $-V_{REF}$.

If the sub-A/D converter 10N-11 determines that the analog input voltage VIN falls within the high-voltage range between the positive reference voltage $V_{REF}$ and the positive ¼ reference voltage $V_{REF}/4$, the sub-A/D converter 10N-11 generates the AD conversion digital signal $b_{N-1}$ of a high level "1". In this case, the pseudorandom number generator 10N-15, the digital multiplier 10N-16, and the second sub-D/A converter 10N-17 generate the dither digital signal $d_{N-1}$ of a medium level "0" or the high level "1", in response to the AD conversion digital signal $b_{N-1}$ of the high level "1".

Further, if the sub-A/D converter 10N-11 determines that the analog input voltage VIN falls within the medium-voltage range between the positive ¼ reference voltage $V_{REF}/4$ and the negative ¼ reference voltage $-V_{REF}/4$, the sub-A/D converter 10N-11 generates the AD conversion digital signal $b_{N-1}$ of the medium level "0". In this case, the pseudorandom number generator 10N-15, the digital multiplier 10N-16, and the second sub-D/A converter 10N-17 generate the dither digital signal $d_{N-1}$ of a low level "−1", the medium level "0", or the high level "1", in response to the AD conversion digital signal $b_{N-1}$ of the medium level "0".

Further, if the sub-A/D converter 10N-11 determines that the analog input voltage VIN falls within the low-voltage range between the negative ¼ reference voltage $-V_{REF}/4$ and the negative reference voltage $-V_{REF}$, the sub-A/D converter 10N-11 generates the AD conversion digital signal $b_{N-1}$ of the low level "−1". In this case, the pseudorandom number generator 10N-15, the digital multiplier 10N-16, and the second sub-D/A converter 10N-17 generate the dither digital signal $d_{N-1}$ of the low level "−1" or the medium level "0", in response to the AD conversion digital signal $b_{N-1}$ of the low level "−1".

Figure 6:
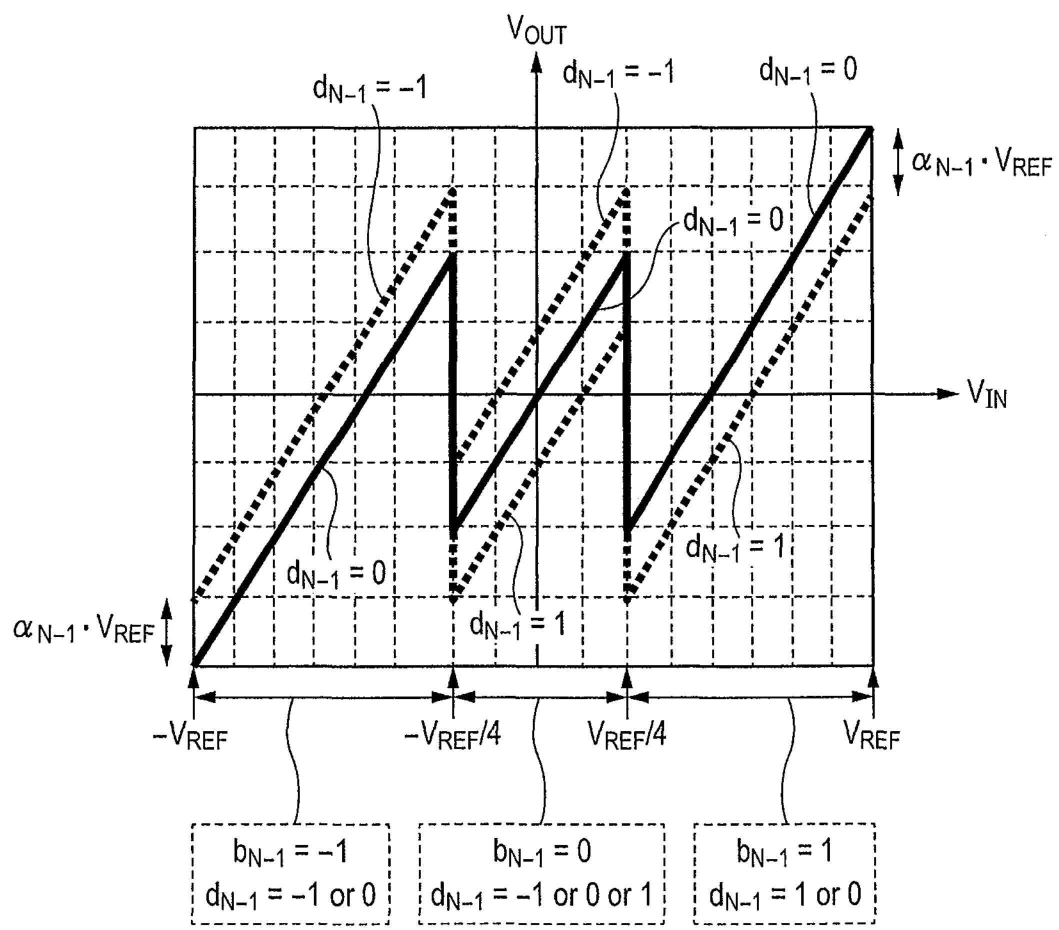
FIG. 6 is a diagram for explaining an analog residual signal $V_{out}$, the AD conversion digital signal $b_{N-1}$, and the dither digital signal $d_{N-1}$ generated from the (N−1)th AD conversion stage 10N-1 of the pipeline type A/D converter according to the second embodiment shown in FIG. 4 in response to an analog input voltage VIN.

FIG. 6 is a diagram for explaining the analog residual signal $V_{out}$, the AD conversion digital signal $b_{N-1}$, and the dither digital signal $d_{N-1}$ generated from the (N−1)th AD conversion stage 10N-1 of the pipeline type A/D converter according to the second embodiment shown in FIG. 4 in response to the analog input voltage VIN.

As described with FIG. 5, if it is determined that the analog input voltage VIN falls within the high-voltage range between the positive reference voltage $V_{REF}$ and the positive ¼ reference voltage $V_{REF}/4$, the AD conversion digital signal $b_{N-1}$ of the high level "1" and the dither digital signal $d_{N-1}$ of the medium level "0" or the high level "1" are generated. In the case where the dither digital signal $d_{N-1}$ is the medium level "0", the voltage level of the analog residual signal $V_{out}$ is relatively high as shown by a thick solid line in the right portion of FIG. 6. In the case where the dither digital signal $d_{N-1}$ is the high level "1", the voltage level of the analog residual signal $V_{out}$ is relatively low as shown by a thick broken line in the right portion of FIG. 6.

As described with FIG. 5, if it is determined that the analog input voltage VIN falls within the medium-voltage range between the positive ¼ reference voltage $V_{REF}/4$ and the negative ¼ reference voltage $-V_{REF}/4$, the AD conversion digital signal $b_{N-1}$ of the medium level "0" and the dither digital signal $d_{N-1}$ of the low level "−1", the medium level "0", or the high level "1" are generated. In the case where the dither digital signal $d_{N-1}$ is the low level "−1", the voltage level of the analog residual signal $V_{out}$ is relatively high as shown by an upper thick broken line in the middle of FIG. 6. In the case where the dither digital signal $d_{N-1}$ is the medium level "0", the voltage level of the analog residual signal $V_{out}$ is relatively medium as shown by a thick solid line in the middle of FIG. 6. In the case where the dither digital signal $d_{N-1}$ is the high level "1", the voltage level of the analog residual signal $V_{out}$ is relatively low as shown by a lower thick broken line in the middle of FIG. 6.

Thus, according to the electronic system 1 according to the second embodiment described with reference to FIGS. 3, 4, 5, and 6, it becomes possible to enhance the convergence speed of weight calculation performed by the first search engine 141 and the second search engine 142 of the calibration unit 14 in the case where the DA conversion analog output signal DAOUT of the D/A conversion unit 11 is the DC voltage or the low-frequency voltage. This is because the weight calculation by the first search engine 141 and the second search engine 142 of the calibration unit 14 is activated in response to the N-bit dither digital signal dk generated from the A/D conversion unit 10 even in the case where the DA conversion analog output signal DAOUT of the D/A conversion unit 11 is the DC voltage or the low-frequency voltage.

The compensation operation in the AD conversion compensation unit 13 according to the second embodiment shown in FIG. 3 is the operation of the inner product of the weight coefficient Wk and a signal (bk+αkdk) obtained by adding the digital signal and the dither digital signal, instead of the inner product of the weight coefficient Wk and the digital signal bk as in the first embodiment of FIG. 1. Further, the weight calculation convergence technique using dither according to the second embodiment differs from the well-known "dither technique" of applying random noise to an analog original input signal in order to reduce quantization errors of a sigma-delta A/D converter or the like.

Another Configuration of A/D Conversion Unit

FIG. 7 is a diagram showing another configuration of the A/D conversion unit 10 for generating the AD conversion digital signal bk and the dither digital signal dk in the electronic system 1 according to the second embodiment shown in FIG. 3.

The A/D conversion unit 10 according to the second embodiment shown in FIG. 7 is comprised of a successive comparison type A/D converter instead of the pipeline type A/D converter shown in FIG. 4. Accordingly, the A/D conversion unit 10 configured in the form of the successive comparison type A/D converter shown in FIG. 7 according to the second embodiment is configured with an analog comparator 10A, a controller 10B, and a sub-D/A converter 10C. The analog input signal ADIN is supplied to a non-inverting input terminal of the analog comparator 10A, and an analog feedback voltage generated from the sub-D/A converter 10C is supplied to an inverting input terminal of the analog comparator 10A.

The analog comparator 10A, the controller 10B, and the sub-D/A converter 10C in the successive comparison type A/D converter perform successive comparison between the analog input signal ADIN and the analog feedback voltage, so that the N-bit AD conversion digital signals $b_1, b_2, b_3 \ldots b_{N-1}, b_N$ are stored in the controller 10B.

In order that the A/D conversion unit 10 configured in the form of the successive comparison type A/D converter according to the second embodiment shown in FIG. 7 generates the N-bit AD conversion digital signal bk and the N-bit dither digital signal dk, a pseudorandom number generator 10D, a digital multiplier 10E, a second sub-D/A converter 10G, and an adder 10H are added to the A/D conversion unit 10.

The N-bit AD conversion digital signals $b_1, b_2, b_3 \ldots b_{N-1}, b_N$ generated from the controller 10B are supplied not only to the sub-D/A converter 10C but also to the pseudorandom number generator 10D. Accordingly, the pseudorandom number generator 10D generates the N-bit dither digital signals $d_1, d_2, d_3 \ldots d_{N-1}, d_N$ in response to the dither generation control signal Dither_gen and the N-bit AD conversion digital signals $b_1, b_2, b_3 \ldots b_{N-1}, b_N$ generated from the controller 10B. Accordingly, the digital multiplier 10E multiplies the N-bit dither digital signals $d_1, d_2, d_3 \ldots d_{N-1}, d_N$ by N predetermined digital multiplier coefficients $\alpha_k$ to generate digital multiplication output signals. The second sub-D/A converter 10G converts the digital multiplication output signals of the digital multiplier 10E into a dither analog output signal, the adder 10H adds the analog feedback voltage of the sub-D/A converter 10C and the dither analog output signal of the second sub-D/A converter 10G, and the addition signal of the adder 10H is supplied to the inverting input terminal of the analog comparator 10A.

The A/D conversion unit 10 comprised of the pipeline type A/D converter according to the second embodiment shown in FIG. 4 generates the N-bit AD conversion digital signal bk and the N-bit dither digital signal dk by the pipeline A/D conversion operation by the AD conversion stages 101, 102, . . . , 10N-1, 10N.

On the other hand, the A/D conversion unit 10 according to the second embodiment shown in FIG. 7 generates the N-bit AD conversion digital signal bk and the N-bit dither digital signal dk by the successive comparison type A/D conversion operation using the analog comparator 10A, the controller 10B, the sub-D/A converter 10C, the pseudorandom number generator 10D, the digital multiplier 10E, the second sub-D/A converter 10G, and the adder 10H.

Third Embodiment

Configuration of Electronic System

FIG. 8 is a diagram showing the configuration of an electronic system 1 according to the third embodiment.

The electronic system 1 according to the third embodiment shown in FIG. 8 differs from the electronic system 1 according to the second embodiment shown in FIG. 3 in the following respect.

That is, in the electronic system 1 according to the third embodiment shown in FIG. 8, the second DA conversion compensation unit 16 and the selector unit 17 included in the electronic system 1 according to the second embodiment shown in FIG. 3 are removed, and instead a calibration value calculation unit 16A and a control register 16B are added.

Accordingly, the calibration value calculation unit 16A and the control register 16B added to the electronic system 1 according to the third embodiment shown in FIG. 8 generates a weight coefficient Yk (k=1, 2 . . . M) for compensating for the non-linearity of the D/A conversion unit 11 in response to the weight coefficient Xk (k=1, 2 . . . M) generated from the first search engine 141 of the calibration unit 14. Consequently, the weight coefficient Yk (k=1, 2 . . . M) for compensating for the non-linearity of the D/A conversion unit 11 generated from the calibration value calculation unit 16A and the control register 16B is directly supplied to the D/A conversion unit 11.

As a result, during the normal operation period after the calibration operation period, the weight coefficient Yk (k=1, 2 . . . M) supplied from the calibration value calculation unit 16A and the control register 16B to the D/A conversion unit 11 compensates for the non-linearity of the D/A conversion unit 11.

On the other hand, during the calibration operation period, in the electronic system 1 according to the third embodiment shown in FIG. 8, the non-linearity of the D/A conversion unit 11 is compensated for by the operating characteristic of the first DA conversion compensation unit 15, in the same way as in the first and second embodiments.

The DA conversion analog output signal DAOUT in the case where the non-linearity is not compensated for by not supplying the weight coefficient Yk (k=1, 2 . . . M) generated from the calibration value calculation unit 16A and the control register 16B to the D/A conversion unit 11 is expressed by the following equation (6).

$$DAOUT = \sum_{k=1}^{M} X_k \cdot D_k \tag{6}$$

On the other hand, the DA conversion analog output signal DAOUT in the case where the non-linearity is compensated for by supplying the weight coefficient Yk (k=1, 2 . . . M) generated from the calibration value calculation unit 16A and the control register 16B to the D/A conversion unit 11 is expressed by the following equation (7).

$$DAOUT = \sum_{k=1}^{M} (X_k + Y_k) \cdot D_k \tag{7}$$

During the calibration operation period, in order that the DA conversion analog output signal DAOUT in the case where the non-linearity is compensated for calculated by the equation (7) becomes equal to the ideal value Value1 of the DA conversion analog output signal DAOUT of the D/A conversion unit 11 calculated by the equation (3), the calibration value calculation unit 16A calculates the weight coefficient Yk (k=1, 2 . . . M) in accordance with the following equation (8).

$$Y_k = \frac{1}{2^k} - X_k \tag{8}$$

Configuration of D/A Conversion Unit Having Non-Linearity Compensated for

FIG. 9 is a diagram showing the configuration of the D/A conversion unit 11 whose non-linearity is compensated for by supplying the weight coefficient Yk (k=1, 2 . . . M) generated from the calibration value calculation unit 16A and the control register 16B to the D/A conversion unit 11 in the electronic system 1 according to the third embodiment shown in FIG. 8.

As shown in FIG. 9, the D/A conversion unit 11 is configured with a plurality of weighted current sources 11A1, 11B1 . . . 11C1, a plurality of switches 11A2, 11B2 . . . 11C2 to which the digital values D1, D2 . . . DM of the DA conversion digital input signal DAIN are supplied, an operational amplifier 11D, and a feedback resistor 11E so as to configure a binary type D/A converter. That is, the current source 11A1 of the most significant bit is weighted so as to pass a maximum current $2^{M-1}I_{REF}$, the current source 11B1 of the second bit is weighted so as to pass a second current $2^{M-2}I_{REF}$, and the current source 11C1 of the least significant bit is weighted so as to pass a minimum current $I_{REF}$.

The on/off states of the switches 11A2, 11B2 . . . 11C2 are determined in response to the digital values D1, D2 . . . DM of the DA conversion digital input signal DAIN, so that a DA conversion analog current which flows through the feedback resistor 11E is determined. The voltage value of the DA conversion analog output signal DAOUT of the D/A conversion unit 11 is determined by the product of the resistance value of the feedback resistor 11E and the current value of the DA conversion analog current.

However, in the D/A conversion unit 11 comprised of the binary type D/A converter configured as described above, the current values of the current sources 11A1, 11B1 . . . 11C1 often have errors from ideal weighting, which causes the non-linearity of D/A conversion of the D/A conversion unit 11.

In order to compensate for the non-linearity of the D/A conversion unit 11, a plurality of compensating current sources 11A3, 11B3 . . . 11C3 are added to the D/A conversion unit 11 shown in FIG. 9. Although FIG. 9 shows only the configuration of the compensating current source 11A3 of the most significant bit for the sake of simplicity, the other compensating current sources 11B3 . . . 11C3 are configured in the same manner as the compensating current source 11A3 of the most significant bit. The compensating current source 11A3 of the most significant bit is configured with a plurality of equally weighted current sources for passing a reference current $I_{REF}$ and a plurality of switches controlled based on the first coefficient Y1 (multiple bits) of the weight coefficient Yk. The second coefficient Y2 (multiple bits) of the weight coefficient Yk is supplied to the compensating current source 11B3 of the second bit, and the last coefficient $Y_M$ (multiple bits) of the weight coefficient Yk is supplied to the last compensating current source 11C3.

According to the electronic system 1 according to the third embodiment described with reference to FIGS. 8 and 9, the weight coefficient Yk is obtained by the equation (8) using the weight coefficient Xk obtained after the calibration operation, and the non-linearity of the D/A conversion unit 11 is compensated for by the weight coefficient Yk supplied from the calibration value calculation unit 16A and the control register 16B to the D/A conversion unit 11.

According to the electronic system 1 according to the third embodiment described with reference to FIGS. 8 and 9, even during the normal operation period after the calibration operation period, the non-linearity of the D/A conversion unit 11 is compensated for by the weight coefficient Yk (k=1, 2 . . . M) supplied from the calibration value calculation unit 16A and the control register 16B to the D/A conversion unit 11. Further, even during the normal operation period, the non-linearity of the A/D conversion unit 10 is cancelled by the operating characteristic of the AD conversion compensation unit 13.

Fourth Embodiment

Configuration of Electronic System

FIG. 10 is a diagram showing the configuration of an electronic system 1 according to the fourth embodiment.

The electronic system 1 according to the fourth embodiment shown in FIG. 10 differs from the electronic system 1 according to the second embodiment shown in FIG. 3 in the following respect.

That is, in the electronic system 1 according to the fourth embodiment shown in FIG. 10, the first DA conversion compensation unit 15 and the selector unit 17 included in the electronic system 1 according to the second embodiment shown in FIG. 3 are removed.

Accordingly, during the calibration operation period, the calibration unit 14 operates so that the difference between the digital value Dk (k=1, 2 . . . M) of the M-bit DA conversion digital input signal DAIN and the AD conversion compensation digital output signal from the AD conversion compensation unit 13 supplied to the subtraction unit 140 of the calibration unit 14 becomes substantially zero. That is, the first search engine 141 and the second search engine 142 respond to the error output signal "e" of the subtraction unit 140 of the calibration unit 14, so that the operating characteristic of the second DA conversion compensation unit 16 and the operating characteristic of the AD conversion compensation unit 13 are determined. More specifically, the operating characteristic of the second DA conversion compensation unit 16 is determined by the first search engine 141 so as to cancel the non-linearity of DA conversion of the D/A conversion unit 11 as the reference D/A conversion unit, and the operating characteristic of the AD conversion compensation unit 13 is determined by the second search engine 142 so as to cancel the non-linearity of AD conversion of the A/D conversion unit 10. That is, the operating characteristic of the AD conversion compensation unit 13 corresponds to the reverse direction conversion of the non-linearity of AD conversion of the A/D conversion unit 10, whereas the operating characteristic of the second DA conversion compensation unit 16 corresponds to the reverse direction conversion of the non-linearity of DA conversion of the D/A conversion unit 11. Accordingly, the first search engine 141 and the second search engine 142 respond to the error output signal "e" of the subtraction unit 140, so that the compensation digital value D'k (k=1, 2 . . . M) of the second DA conversion compensation unit 16 is determined by the first search engine 141, and the weight coefficient Wk (k=1, 2 . . . N) of the AD conversion compensation unit 13 is determined by the second search engine 142.

Further, in the electronic system 1 according to the fourth embodiment shown in FIG. 10, even during the normal operation period after the calibration operation period, the operating characteristic of the second DA conversion compensation unit 16 cancels the non-linearity of DA conversion of the D/A conversion unit 11. That is, the second DA conversion compensation unit 16 determines the operating characteristic of the second DA conversion compensation unit 16 by using the weight coefficient Xk (k=1, 2 . . . M) stored in the internal register. That is, the operating characteristic of the second DA conversion compensation unit 16 corresponds to the reverse direction conversion of the non-linearity of DA conversion of the D/A conversion unit 11.

That is, the second DA conversion compensation unit 16 generates the compensation digital value D'k (k=1, 2 . . . M) by using the digital value Dk (k=1, 2 . . . M) of the DA conversion digital input signal DAIN and the weight coefficient Xk (k=1, 2 . . . M) stored in the internal register. More specifically, the compensation digital value D'k (k=1, 2 . . . M) from the second DA conversion compensation unit 16 is generated by reverse direction conversion of the digital value Dk (k=1, 2 . . . M) of the DA conversion digital input signal DAIN by the non-linearity of DA conversion of the D/A conversion unit 11. Therefore, during the calibration operation period and the subsequent normal operation period, the operating characteristic of the second DA conversion compensation unit 16 cancels the non-linearity of DA conversion of the D/A conversion unit 11. Therefore, even though the low-precision D/A conversion unit 11 is used, the high-precision DA conversion analog output signal DAOUT can be generated via the DA conversion output switch 18 from the output terminal of the D/A conversion unit 11.

Further, in the electronic system 1 according to the fourth embodiment shown in FIG. 10 as well as in the electronic system 1 described with reference to FIGS. 1 and 2, the second DA conversion compensation unit 16 operates at least M times faster than the D/A conversion unit 11.

Fifth Embodiment

Configuration of Electronic System

FIG. 11 is a diagram showing the configuration of an electronic system 1 according to the fifth embodiment.

The electronic system 1 according to the fifth embodiment shown in FIG. 11 differs from the electronic system 1 according to the second embodiment shown in FIG. 3 in the following respect.

That is, in the electronic system 1 according to the fourth embodiment shown in FIG. 10, the A/D conversion unit 10 does not generate the dither digital signal dk for improving the convergence speed of weight calculation performed by the calibration unit 14 as in the electronic system 1 according to the second embodiment shown in FIG. 3, but the D/A conversion unit 11 generates a dither analog output signal.

That is, in the electronic system 1 according to the fifth embodiment in FIG. 11, during the calibration operation period, the D/A conversion unit 11 generates the dither analog output signal, thereby making it possible to improve the convergence speed of weight calculation performed by the first search engine 141 and the second search engine 142 of the calibration unit 14.

On the other hand, in the electronic system 1 according to the fifth embodiment in FIG. 11, during the normal operation period after the calibration operation period, the D/A conversion unit 11 stops the generation of the dither analog output signal.

Configuration of D/A Conversion Unit for Generating Dither Analog Output Signal

FIG. 12 is a diagram showing the configuration of the D/A conversion unit 11 for generating the dither analog output signal in response to the dither generation control signal Dither_gen in the electronic system 1 according to the fifth embodiment shown in FIG. 11.

As shown in FIG. 12, the D/A conversion unit 11 is configured with a plurality of weighted current sources 11A1, 11B1 . . . 11C1, a plurality of switches 11A2, 11B2 . . . 11C2 to which the digital values D1, D2 . . . DM of the DA conversion digital input signal DAIN are supplied, an operational amplifier 11D, and a feedback resistor 11E so as to configure a binary type D/A converter. That is, the current source 11A1 of the most significant bit is weighted so as to pass a maximum current $2^{M-1}I_{REF}$, the current source 11B1 of the second bit is weighted so as to pass a second current $2^{M-2}I_{REF}$, and the current source 11C1 of the least significant bit is weighted so as to pass a minimum current $R_{REF}$.

The on/off states of the switches 11A2, 11B2 . . . 11C2 are determined in response to the digital values D1, D2 . . . DM of the DA conversion digital input signal DAIN, so that a DA conversion analog current which flows through the feedback resistor 11E is determined. The voltage value of the DA conversion analog output signal DAOUT of the D/A conversion unit 11 is determined by the product of the resistance value of the feedback resistor 11E and the current value of the DA conversion analog current.

The D/A conversion unit 11 further includes a pseudorandom number generator 11G and a dither analog current generation unit 11F, in order to generate the dither analog output signal. The pseudorandom number generator 11G generates M-bit dither digital signals $d_1, d_2 \ldots d_M$ in response to the dither generation control signal Dither_gen and the digital value Dk (k=1, 2 . . . M) of the DA conversion digital input signal DAIN as necessary during the calibration operation period.

The dither analog current generation unit 11F is configured with a plurality of dither current sources 11A4, 11B4 . . . 11C4 weighted by digital multiplier coefficients $A_1, \alpha_2 \ldots \alpha_M$ and a plurality of switches 11A3, 11B3 . . . 11C3 to which the M-bit dither digital signals $d_1, d_2 \ldots d_M$ are supplied.

During the normal operation period after the calibration operation period, the dither generation control signal Dither_gen is at the low level, which deactivates the pseudorandom number generator 11G, so that the M-bit dither digital signals $d_1, d_2 \ldots d_M$ are all "0". Therefore, the DA conversion analog output signal DAOUT of the D/A conversion unit 11 does not include the analog current component of the dither analog current generation unit 11F.

Sixth Embodiment

Figure 13:
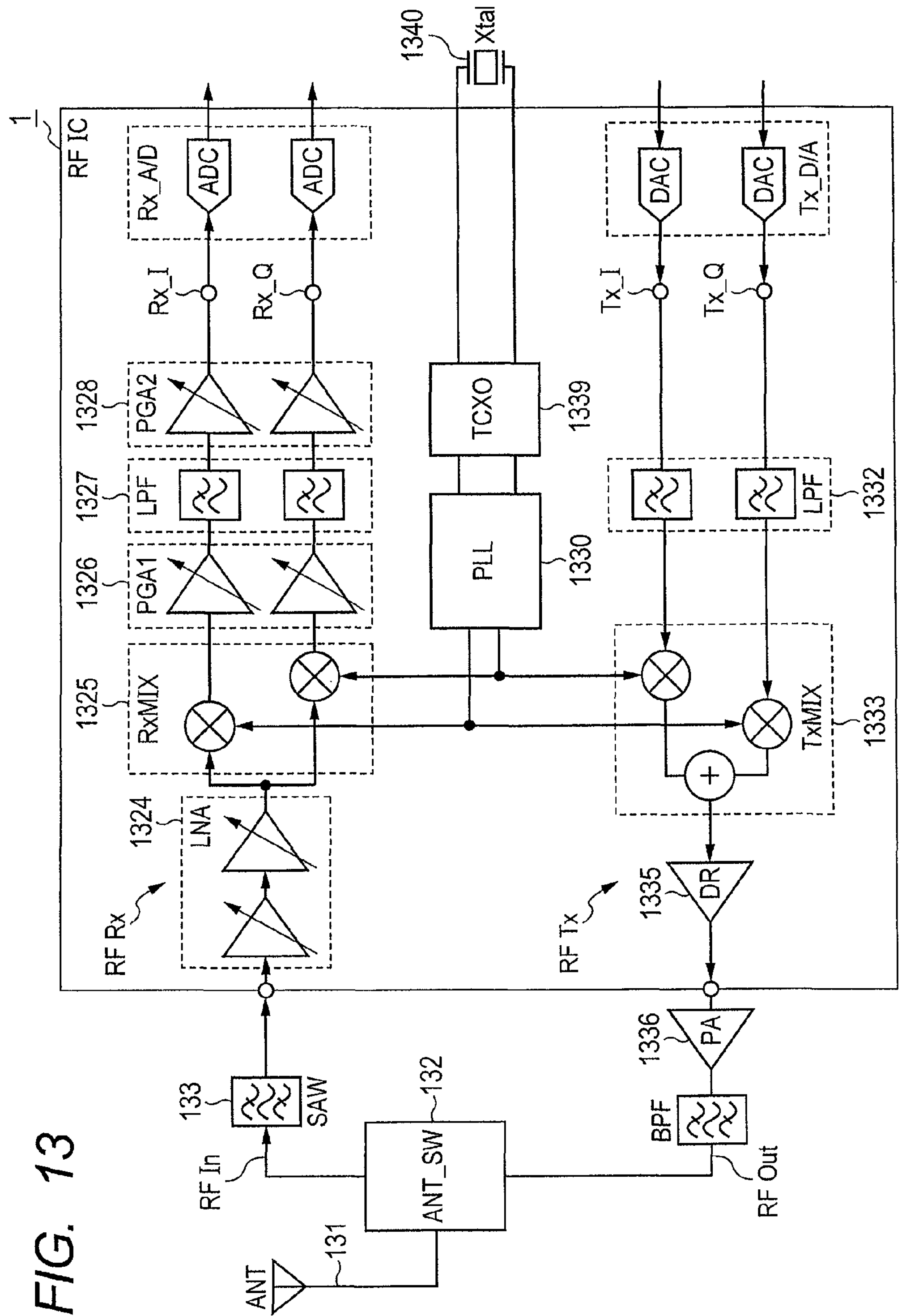
FIG. 13 is a diagram showing the configuration of an RF analog semiconductor integrated circuit 1 according to a sixth embodiment used in a wireless LAN.

FIG. 13 is a diagram showing the configuration of an RF analog semiconductor integrated circuit 1 according to the sixth embodiment used in a wireless LAN.

The RF analog semiconductor integrated circuit 1 shown in FIG. 13 can be used in a LAN terminal of the wireless LAN and in an access point hub as a communication partner of the LAN terminal. An antenna switch 132 is coupled to an antenna 131. The supply of an RF reception input signal from the antenna 131 to a receiver system and the supply of an RF transmission output signal from a transmitter system to the antenna 131 are performed by time division multiplexing access (TDMA).

A direct downconversion receiver system RF Rx of the RF analog semiconductor integrated circuit 1 shown in FIG. 13 supports a frequency band of about 5 GHz (5.15 to 5.35 GHz) based on the IEEE802.11a standard. Accordingly, the direct downconversion receiver system RF Rx is configured with a low noise amplifier 1324, a reception mixer 1325, programmable gain amplifiers 1326 and 1328 and a low-pass filter 1327. Analog reception baseband signals Rx_I and Rx_Q generated by the direct downconversion receiver system RF Rx are supplied to input terminals of a reception A/D converter Rx_A/D, and digital reception baseband signals generated from output terminals of the reception A/D converter Rx_A/D are supplied to a baseband processing unit (not shown).

Digital transmission baseband signals generated from the baseband processing unit (not shown) are supplied to input terminals of a transmission D/A converter Tx_D/A, and analog transmission baseband signals Tx_I and Tx_Q are generated from output terminals of the transmission D/A converter Tx_D/A. The analog transmission baseband signals Tx_I and Tx_Q are converted by a direct upconversion transmitter system RF Tx into the frequency band of about 5 GHz based on the IEEE802.11a standard. The direct upconversion transmitter system RF Tx is configured with a low-pass filter 1332, a transmission mixer 1333 and a driver amplifier 1335 to support the frequency band of about 5 GHz based on the IEEE802.11a standard. An RF power amplifier 1336 and a bandpass filter BPF are coupled to an output terminal of the driver amplifier 1335 outside the RF analog semiconductor integrated circuit 1. Further, a surface acoustic wave filter 133 is coupled to the input of the low noise amplifier 24 outside the RF analog semiconductor integrated circuit 1.

Reception local signals supplied to the reception mixer 1325 of the RF analog semiconductor integrated circuit 1 and transmission local signals supplied to the transmission mixer 1333 are generated from a ΣΔ fractional PLL frequency synthesizer 1330. A system reference frequency oscillator (TCXO) 1339 is coupled to the PLL frequency synthesizer 1330, and a crystal resonator 1340 is coupled to the system reference frequency oscillator 1339 outside the RF analog semiconductor integrated circuit 1.

Further, the system reference frequency oscillator (TCXO) 1339 may be formed outside the RF analog semiconductor integrated circuit 1, and a clock buffer may be formed inside the RF analog semiconductor integrated circuit 1. The clock buffer lying inside the integrated circuit receives a system reference frequency clock signal generated from the system reference frequency oscillator (TCXO) 1339 outside the integrated circuit and supplies the clock signal to the ΣΔ fractional PLL frequency synthesizer 1330 provided inside the integrated circuit.

The D/A conversion unit 11 and the A/D conversion unit 10 according to any one of the first to fifth embodiments are used as the two D/A converters of the transmission D/A converter Tx_D/A and the two A/D converters of the reception A/D converter Rx_A/D respectively integrated in the RF analog semiconductor integrated circuit 1 according to the sixth embodiment shown in FIG. 13.

Therefore, in the RF analog semiconductor integrated circuit 1 according to the sixth embodiment shown in FIG. 13, the compensation operation of the non-linearity of the D/A conversion unit 11 and the compensation operation of the non-linearity of the A/D conversion unit 10 according to any one of the first to fifth embodiments are performed.

Seventh Embodiment

FIG. 14 is a diagram showing the configuration of a semiconductor integrated circuit 1 according to the seventh embodiment configured as a single-chip microcomputer.

The semiconductor integrated circuit 1 according to the seventh embodiment configured as the single-chip microcomputer shown in FIG. 14 includes a CPU core 1410, a peripheral core 1420, and an analog core 1430.

The CPU core 1410 includes a processing unit 1411 having a central processing unit (CPU), a floating point unit (FPU), and a digital multiplier (MULT), an embedded nonvolatile memory 1412, an embedded volatile memory 1413, and an internal source voltage supply circuit 1414. The CPU core 1410 further includes an internal address bus Int_Adr_Bus and an internal data bus Int_Dt_Bus. The embedded nonvolatile memory 1412 is comprised of an on-chip flash memory, and the embedded volatile memory 1413 is comprised of an on-chip RAM (Random Access Memory).

The peripheral core 1420 and the analog core 1430 are coupled to the internal address bus Int_Adr_Bus and the internal data bus Int_Dt_Bus of the CPU core 1410.

As shown in FIG. 14, the peripheral core 1420 includes a direct memory access controller 1421, a bus state controller 1422, an interrupt controller 1423, a timer 1424, a controller area network 1425, an external port 1426, and a serial communication interface 1427.

The direct memory access controller 1421 directly transfers data between the embedded volatile memory 1413 and a memory or an input/output device (I/O) outside the semiconductor integrated circuit 1 in accordance with an instruction from the central processing unit (CPU), so that the central processing unit (CPU) can execute other tasks during the data transfer.

The bus state controller 1422 can access an external memory such as an SRAM or a ROM coupled to the semiconductor integrated circuit 1, via a peripheral address bus Ph_Adr_Bus, a peripheral data bus Ph_Dt_Bus, and the external port 1426.

The interrupt controller 1423 supplies an interrupt request from an external input/output device or an external peripheral device coupled to the semiconductor integrated circuit 1 to the central processing unit (CPU). The external interrupt request is supplied to the interrupt controller 1423 via the external port 1426 and the peripheral data bus Ph_Dt_Bus. In response to the interrupt request from the interrupt controller 1423, the central processing unit (CPU) interrupts normal processing currently being executed, and then executes interrupt processing. After the completion of the interrupt processing, the central processing unit (CPU) resumes the normal processing.

The timer 1424 is a hardware timing device such as a watchdog timer. For example, the timer 1424 performs time measurement for time-out processing, and exception processing such as a system reset is performed when processing by the central processing unit (CPU) hangs up.

The controller area network 1425 is used to transfer information such as a speed, an engine speed, the state of a brake, fault diagnosis in an automobile, designed in consideration of enhancement of noise immunity, and used to transfer data between interconnected devices. Furthermore, the controller area network 1425 is widely used to transfer device control information, and also can be used in transport equipment, factories, and robots such as machine tools.

The external port 1426 is used to access the external devices of the semiconductor integrated circuit 1 as described above.

The serial communication interface 1427 enables serial data communications with the external devices of the semiconductor integrated circuit 1.

An analog-digital converter (ADC) 1431 of the analog core 1430 converts an analog signal supplied from outside the semiconductor integrated circuit 1 into a digital signal, which is supplied to the CPU core 1410 via the peripheral data bus Ph_Dt_Bus and the direct memory access controller 1421 or the bus state controller 1422.

A digital-analog converter (DAC) 1432 of the analog core 1430 converts a digital signal generated from the CPU core 1410 into an analog signal, which is supplied to outside the semiconductor integrated circuit 1.

The A/D conversion unit 10 and the D/A conversion unit 11 according to any one of the first to fifth embodiments are used as the analog-digital converter (ADC) 1431 and the digital-analog converter (DAC) 1432 respectively formed in the semiconductor integrated circuit 1 according to the seventh embodiment configured as the single-chip microcomputer shown in FIG. 14.

Therefore, in the semiconductor integrated circuit 1 configured as a single-chip microcomputer according to the seventh embodiment shown in FIG. 14, the compensation operation of the non-linearity of the D/A conversion unit 11 and the compensation operation of the non-linearity of the A/D conversion unit 10 according to any one of the first to fifth embodiments are performed.

While the invention made above by the present inventors has been described specifically based on the illustrated embodiments, the present invention is not limited thereto. It is needless to say that various changes and modifications can be made thereto without departing from the spirit and scope of the invention.

For example, the dither signals according the above embodiments can use not only random signals such as pseudorandom numbers and random numbers but also regular signals such as periodic signals and other signals.

For example, the electronic system 1 in which the compensation operation of the non-linearity of the D/A conversion unit 11 and the compensation operation of the non-linearity of the A/D conversion unit 10 are performed can be implemented by mounting a plurality of semiconductor integrated circuits over a printed circuit board.

For example, the electronic system 1 in which the compensation operation of the non-linearity of the D/A conversion unit 11 and the compensation operation of the non-linearity of the A/D conversion unit 10 are performed is not limited to the RF analog semiconductor integrated circuit and the single-chip microcomputer, and can be applied to other semiconductor integrated circuits, for example to a system LSI and a system-on-chip used for a variety of purposes.

What is claimed is:

1. A semiconductor integrated circuit comprising:

an A/D conversion unit;

a D/A conversion unit;

a calibration unit;

an AD conversion compensation unit, which compensates an output signal of the A/D conversion unit and outputs an output digital signal;

a DA conversion compensation unit, which compensates an input digital signal and outputs a first compensation digital signal and a second compensation digital signal;

a selector, which selects one of the input digital signal and the first compensation digital signal, and outputs the one of the input digital signal and the first compensation digital signal to the D/A conversion unit; and a first switch connected to an input terminal of the A/D conversion unit and an output terminal of the D/A conversion unit, wherein the calibration unit determines an operating characteristic of the AD conversion compensation unit in response to the output signal of the A/D conversion unit and a difference between the output digital signal and the second compensation digital signal, and wherein the calibration unit determines an operating characteristic of the DA conversion compensation unit in response to the input digital signal and the difference between the output digital signal and the second compensation digital signal.

2. The semiconductor integrated circuit according to claim 1, wherein during a calibration operation period, the first switch is turned on and the selector selects the input digital signal, and wherein during a normal operation period, the first switch is turned off and the selector selects the first compensation digital signal.

3. The semiconductor integrated circuit according to claim 2, further comprising:

a second switch connected to an output terminal of the D/A conversion unit; and a third switch connected to an input terminal of the A/D conversion unit, wherein during the calibration operation period, the second and the third switches are turned off.

4. The semiconductor integrated circuit according to the claim 3, wherein the calibration unit comprises: a subtraction unit, which calculates the difference between the output digital signal and the second compensation digital signal;

a first search engine, which determines the operating characteristic of the DA conversion compensation unit in response to the input digital signal and the difference between the output digital signal and the second compensation digital signal; and a second search engine, which determines the operating characteristic of the AD conversion compensation unit in response to the output signal of the A/D conversion unit and the difference between the output digital signal and the second compensation digital signal.

5. The semiconductor integrated circuit according to the claim 4, wherein the operation characteristic of the DA conversion compensation unit is determined by storing weight coefficients in an internal register of the DA conversion compensation unit, and wherein the operation characteristic of the AD conversion compensation unit is determined by storing weight coefficients in an internal register of the AD conversion compensation unit.

* * * * *